(12) United States Patent
Inoue et al.

(10) Patent No.: US 10,411,223 B2
(45) Date of Patent: Sep. 10, 2019

(54) ORGANIC ELECTROLUMINESCENCE DEVICE AND ILLUMINATION DEVICE

(71) Applicant: Sharp Kabushiki Kaisha, Sakai, Osaka (JP)

(72) Inventors: Satoshi Inoue, Sakai (JP); Katsuhiro Kikuchi, Sakai (JP); Hideki Uchida, Sakai (JP); Yoshiyuki Isomura, Sakai (JP); Masanori Ohara, Sakai (JP); Yuto Tsukamoto, Sakai (JP); Eiji Koike, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 54 days.

(21) Appl. No.: 15/758,435

(22) PCT Filed: Sep. 7, 2016

(86) PCT No.: PCT/JP2016/076300
§ 371 (c)(1),
(2) Date: Mar. 8, 2018

(87) PCT Pub. No.: WO2017/043529
PCT Pub. Date: Mar. 16, 2017

(65) Prior Publication Data
US 2018/0212198 A1    Jul. 26, 2018

(30) Foreign Application Priority Data

Sep. 8, 2015    (JP) .................................. 2015-176582

(51) Int. Cl.
*H01L 51/52*    (2006.01)
*H05B 33/02*    (2006.01)
(Continued)

(52) U.S. Cl.
CPC ...... *H01L 51/5271* (2013.01); *H01L 27/3248* (2013.01); *H01L 27/3258* (2013.01);
(Continued)

(58) Field of Classification Search
CPC ............. H01L 51/5212; H01L 51/5271; H01L 27/3276; H01L 27/3248; H05B 33/22; H05B 33/24
See application file for complete search history.

(56) References Cited

U.S. PATENT DOCUMENTS

2001/0019133 A1    9/2001    Konuma et al.
2014/0312323 A1*   10/2014   Park ...................... H01L 51/525
                                              257/40

(Continued)

FOREIGN PATENT DOCUMENTS

JP    2003-229283 A    8/2003
JP    2006-221902 A    8/2006
JP    2014-103117 A    6/2014

OTHER PUBLICATIONS

English Translation of JP 2006221902 originally published on Aug. 24, 2006.*
(Continued)

*Primary Examiner* — Grant S Withers
(74) *Attorney, Agent, or Firm* — Keating & Bennett, LLP

(57) ABSTRACT

The electroluminescence device of the disclosure includes: a base material provided with a recessed portion; a light-emitting element including a reflective layer provided on the front surface of the recessed portion, a filling layer having optical transparency and filling an inside of the recessed portion with the reflective layer interposed therebetween, a first electrode having optical transparency provided on the filling layer, an organic layer including a light-emitting layer provided on the first electrode, and a second electrode having optical transparency provided on the organic layer, (Continued)

and an active element connected to the light-emitting element, wherein a display region includes a plurality of unit regions divided from one another, the unit regions include a plurality of the light-emitting elements and the active elements configured to control the light emission of the plurality of light-emitting elements, and the reflective layer of at least one of the light-emitting elements of the plurality of recessed portions functions as a contact portion with the active element.

12 Claims, 24 Drawing Sheets

(51) Int. Cl.
　　　*H05B 33/10*　　　(2006.01)
　　　*H05B 33/22*　　　(2006.01)
　　　*H05B 33/24*　　　(2006.01)
　　　*H05B 33/26*　　　(2006.01)
　　　*H05B 33/28*　　　(2006.01)
　　　*H01L 27/32*　　　(2006.01)
　　　*H01L 27/12*　　　(2006.01)
　　　*H01L 29/786*　　　(2006.01)

(52) U.S. Cl.
　　　CPC ...... *H01L 27/3262* (2013.01); *H01L 27/3279* (2013.01); *H01L 51/5212* (2013.01); *H05B 33/02* (2013.01); *H05B 33/10* (2013.01); *H05B 33/22* (2013.01); *H05B 33/24* (2013.01); *H05B 33/26* (2013.01); *H05B 33/28* (2013.01); *H01L 27/124* (2013.01); *H01L 27/1222* (2013.01); *H01L 29/78636* (2013.01); *H01L 29/78675* (2013.01); *H01L 2227/323* (2013.01); *H01L 2251/5315* (2013.01)

(56) References Cited

U.S. PATENT DOCUMENTS

| | | | |
|---|---|---|---|
| 2016/0149154 A1* | 5/2016 | Park | H01L 51/5209 257/40 |
| 2016/0268358 A1* | 9/2016 | Ito | H01L 51/5271 |
| 2017/0098793 A1* | 4/2017 | Isomura | H01L 51/002 |
| 2017/0125507 A1* | 5/2017 | Lee | H01L 27/3213 |
| 2017/0133620 A1* | 5/2017 | Lee | H01L 51/5212 |
| 2018/0122875 A1* | 5/2018 | Bang | H01L 51/5212 |
| 2018/0269428 A1* | 9/2018 | Uchida | G02B 5/20 |
| 2018/0287099 A1* | 10/2018 | Uchida | G02B 5/20 |
| 2018/0323404 A1* | 11/2018 | Inoue | G09F 9/00 |

OTHER PUBLICATIONS

Official Communication issued in International Patent Application No. PCT/JP2016/076300, dated Dec. 6, 2016.

\* cited by examiner

ORGANIC ELECTROLUMINESCENCE DEVICE AND ILLUMINATION DEVICE

TECHNICAL FIELD

Several aspects of disclosure relate to an organic electroluminescence device, a method for producing an organic electroluminescence device, an illumination device, and a display device.

This application claims priority from JP 2015-176582 A, filed Sep. 8, 2015 in Japan, the entirety of which is incorporated by reference herein.

BACKGROUND ART

The development of organic EL elements (OLEDs) has been advanced as candidates for next-generation display technology.

An organic EL element is a self light-emitting element, and the light emission area is defined by the opening region of an insulating layer called an edge cover. Since an entire organic EL element has a very thin film thickness of around 200 nm, an organic EL element cannot be formed in areas with large concavities and convexities such as contact holes for connecting pixel electrodes and circuit wiring line. Therefore, there is a problem that the reduction in light emission area due to contact holes becomes more substantial as the resolution becomes higher.

A contact hole needs to have an external size of about 10 μm due to the relationship between the contact resistances of the pixel electrodes and the circuit wiring line. Therefore, as the resolution of the panel becomes higher, the occupied area of contact holes in pixels becomes larger, and the reduction in the light emission area becomes more severe.

In addition, a contact hole is formed to have a steep wall surface. Therefore, when an organic EL element, which is a thin film, is formed inside a contact hole, there may be shorting between the upper and lower electrodes of the organic EL element, or pixel defects may arise without emitting light.

PTL 1 discloses technology for overcoming poor light emission of an organic EL element due to poor film formation of an organic EL material in a contact hole. In PTL 1, poor film formation of an organic EL material in an electrode hole of a pixel electrode can be prevented by forming a film of the organic EL material after forming a protection part by embedding an insulator in the electrode hole. This prevents current from being concentrated due to shorting between the upper electrode and lower electrode of the organic EL element and prevents poor light emission of the organic EL layer.

CITATION LIST

Patent Literature

PTL 1: JP 2014-103117 A

SUMMARY

Technical Problem

However, in PTL 1, the lower electrode of the organic EL element is not formed in the electrode hole, and thus the organic EL element does not emit light over the contact hole. In the case of such a configuration, the non-emissive region corresponding to the contact hole occupies a large portion of the pixel area, and thus increasing the resolution of the display panel is difficult.

In addition, the cross-sectional shape of the contact hole is an inverted trapezoidal shape, and there are no prospects for improvement in light extraction efficiency or improvements in the luminance of each pixel.

One aspect of the disclosure was conceived in light of the problems of the known technology described above. An object of the disclosure is to provide an organic electroluminescence device, a method for producing an organic electroluminescence device, an illumination device, and a display device capable of increasing the resolution of a display by emitting light over contact holes and capable of improving luminance by enhancing the light extraction efficiency of elements.

Solution to Problem

The organic electroluminescence device of one aspect of the disclosure includes: a base material provided with a recessed portion on one side; a light-emitting element including a reflective layer provided on at least a surface of the recessed portion, a filling layer having optical transparency and filling an inside of the recessed portion with the reflective layer interposed therebetween, a first electrode having optical transparency provided on at least an upper layer side of the filling layer, an organic layer including at least a light-emitting layer provided on an upper layer of the first electrode, and a second electrode having optical transparency provided on an upper layer side of the organic layer; and an active element connected to the light-emitting element, wherein a display region includes a plurality of unit regions divided from one another, the unit regions include the light-emitting elements formed in a plurality of the recessed portions and the active elements configured to control the light emission of the light-emitting elements, and the light-emitting elements and the active elements are electrically connected via at least one of the plurality of recessed portions.

In the organic electroluminescence device of one aspect of the disclosure, the light-emitting elements and the active elements may be electrically connected via the plurality of recessed portions present in the unit regions.

The organic electroluminescence device of one aspect of the disclosure may further include a protection film formed on an upper layer of the active elements and a flattening film formed on an upper layer of the protection film, wherein the plurality of recessed portions are formed on the protection film.

In the organic electroluminescence device of one aspect of the disclosure, an opening exposing the wiring line of the active element may be provided in the at least one recessed portion, and the wiring line and the reflective layer are connected via the opening.

In the organic electroluminescence device of one aspect of the disclosure, the recessed portion may include at least a portion of the wiring line of the active element.

The organic electroluminescence device of one aspect of the disclosure includes a base material provided with a recessed portion on one side; a light-emitting element including a reflective layer provided on at least a surface of the recessed portion, a filling layer having optical transparency and filling an inside of the recessed portion with the reflective layer interposed therebetween, a first electrode having optical transparency provided on at least an upper layer side of the filling layer, an organic layer including at least a light-emitting layer provided on an upper layer of the first electrode, and a second electrode having optical transparency provided on an upper layer side of the organic layer; and an active element connected to the light-emitting element, wherein a display region includes a plurality of unit regions divided from one another, the unit regions include a plurality of the light-emitting elements and the active elements configured to control the light emission of the plurality of light-emitting elements, and, of the recessed portions, the reflective layer formed in a plurality of first recessed portions formed in an interlayer insulating film of the active element functions as a drain electrode of the active element.

In the organic electroluminescence device of one aspect of the disclosure, a second recessed portion may be formed in the interlayer insulating film, and a second reflective layer formed in the second recessed portion may function as a source electrode of the active element.

In the organic electroluminescence device of one aspect of the disclosure, the sizes of the plurality of light-emitting elements in a plan view may differ from one another.

The method for producing an organic electroluminescence device according to one aspect of the disclosure includes: forming a recessed portion on one side of a base material; forming a light-emitting element by forming a reflective layer at least along a surface of the recessed portion, forming a filling layer having optical transparency on an inside of the recessed portion with the reflective layer interposed therebetween, forming a first electrode having optical transparency on at least an upper layer side of the filling layer, forming an organic layer including at least a light-emitting layer on an upper layer side of the first electrode, and forming a second electrode having optical transparency and optical reflectivity on an upper layer side of the organic layer; and forming an active element to be connected to the light-emitting element on the one side, wherein a display region includes a plurality of unit regions divided from one another, the unit regions include the light-emitting elements formed in a plurality of the recessed portions and the active elements configured to control the light emission of the light-emitting elements, and the light-emitting elements and the active elements are electrically connected via at least one of the plurality of recessed portions.

In the organic electroluminescence device of one aspect of the disclosure, when forming the recessed portion, the recessed portion may be formed to include a portion of a drain electrode of the active element.

The method for producing an organic electroluminescence device according to one aspect of the disclosure includes: forming a recessed portion on one side of a base material; forming a light-emitting element by forming a reflective layer at least along a surface of the recessed portion, forming a filling layer having optical transparency on an inside of the recessed portion with the reflective layer interposed therebetween, forming a first electrode having optical transparency on at least an upper layer side of the filling layer, forming an organic layer including at least a light-emitting layer on an upper layer side of the first electrode, and forming a second electrode having optical transparency and optical reflectivity on an upper layer side of the organic layer; and forming an active element to be connected to the light-emitting element on the one side, wherein a display region includes a plurality of unit regions divided from one another, a plurality of the light-emitting elements and the active elements configured to control the light emission of the plurality of light-emitting elements are formed in the unit regions, a plurality of first recessed portions are formed in an interlayer insulating film of the active elements, and the reflective layer formed in at least one of the plurality of first recessed portions functions as a drain electrode of the active element.

The illumination device of one aspect of the disclosure includes: a base material provided with a recessed portion on one side; a light-emitting element including a reflective layer provided on at least a surface of the recessed portion, a filling layer having optical transparency and filling an inside of the recessed portion with the reflective layer interposed therebetween, a first electrode having optical transparency provided on at least an upper layer side of the filling layer, an organic layer including at least a light-emitting layer provided on an upper layer of the first electrode, and a second electrode having optical transparency provided on an upper layer side of the organic layer; and an active element connected to the light-emitting element, wherein a display region includes a plurality of unit regions divided from one another, the unit regions include the light-emitting elements formed in the plurality of recessed portions and the active elements configured to control the light emission of the light-emitting elements, and the light-emitting elements and the active elements are electrically connected via at least one of the plurality of recessed portions.

The illumination device of one aspect of the disclosure includes: a base material provided with a recessed portion on one side; a light-emitting element including a reflective layer provided on at least a surface of the recessed portion, a filling layer having optical transparency and filling an inside of the recessed portion with the reflective layer interposed therebetween, a first electrode having optical transparency provided on at least an upper layer side of the filling layer, an organic layer including at least a light-emitting layer provided on an upper layer of the first electrode, and a second electrode having optical transparency provided on an upper layer side of the organic layer; and an active element connected to the light-emitting element, wherein a display region includes a plurality of unit regions divided from one another, the unit regions include a plurality of the light-emitting elements and the active elements configured to control the light emission of the plurality of light-emitting elements, a plurality of first recessed portions are formed in an interlayer insulating film of the active elements, and the reflective layer formed in the plurality of first electrodes functions as a drain electrode of the active element.

The display device of one aspect of the disclosure includes: a base material provided with a recessed portion on one side; a light-emitting element including a reflective layer provided on at least a surface of the recessed portion, a filling layer having optical transparency and filling the inside of the recessed portion with the reflective layer interposed therebetween, a first electrode having optical transparency provided on at least an upper layer side of the filling layer, an organic layer including at least a light-emitting layer provided on an upper layer of the first electrode, and a second electrode having optical transparency provided on an upper layer side of the organic layer; and an active element connected to the light-emitting element, wherein a display region includes a plurality of unit regions divided from one another, the unit regions include light-emitting elements formed in the plurality of recessed portions and the active elements configured to control the light emission of the light-emitting elements, and the light-emitting elements and the active elements are electrically connected via at least one of the plurality of recessed portions.

The display device of one aspect of the disclosure includes: a base material provided with a recessed portion on one side; a light-emitting element including a reflective layer provided on at least a surface of the recessed portion, a filling layer having optical transparency and filling the inside of the recessed portion with the reflective layer interposed therebetween, a first electrode having optical transparency provided on at least an upper layer side of the filling layer, an organic layer including at least a light-emitting layer provided on an upper layer of the first electrode, and a second electrode having optical transparency provided on an upper layer side of the organic layer; and an active element connected to the light-emitting element, wherein a display region includes a plurality of unit regions divided from one another, the unit regions include a plurality of the light-emitting elements and the active elements configured to control the light emission of the plurality of light-emitting elements, a plurality of first recessed portions are formed in an interlayer insulating film of the active elements, and the reflective layer formed in the plurality of first electrodes functions as a drain electrode of the active element.

Advantageous Effects of Disclosure

According to several aspects of the disclosure, an organic electroluminescent device, a method for producing an organic electroluminescence device, an illumination device, and a display device can be provided.

DESCRIPTION OF EMBODIMENTS

Embodiments of the disclosure will be described hereinafter.

Note that in each of the figures below, the dimensional scale is illustrated differently depending on the component, such that each component is easily visible.

First Embodiment

An organic EL device of a first embodiment of the disclosure will be described hereinafter.

The organic EL device of the first embodiment is an example of a top-emitting display employing a microcavity structure.

Figure 1:
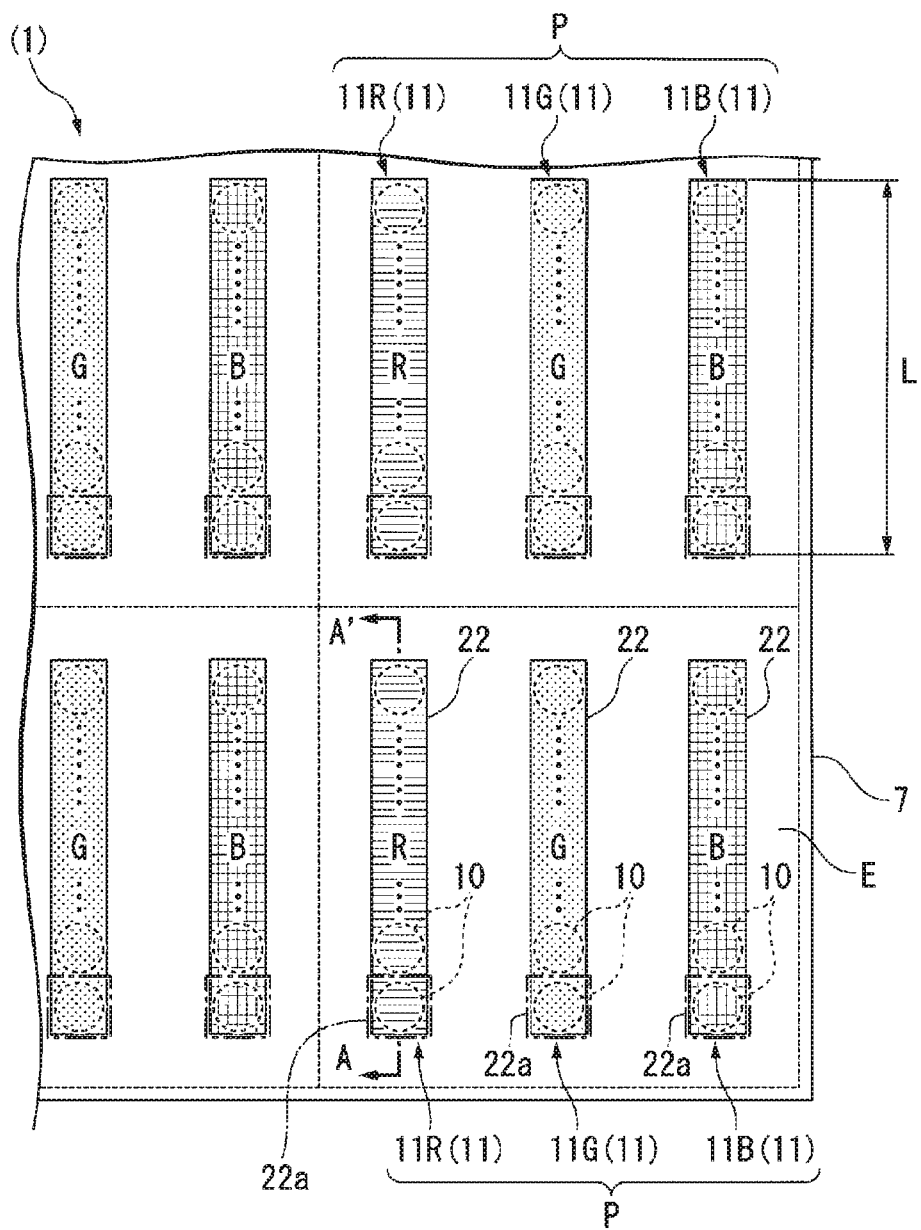
FIG. 1 is a magnified plan view illustrating a portion of the organic EL device of a first embodiment.
Figure 2:
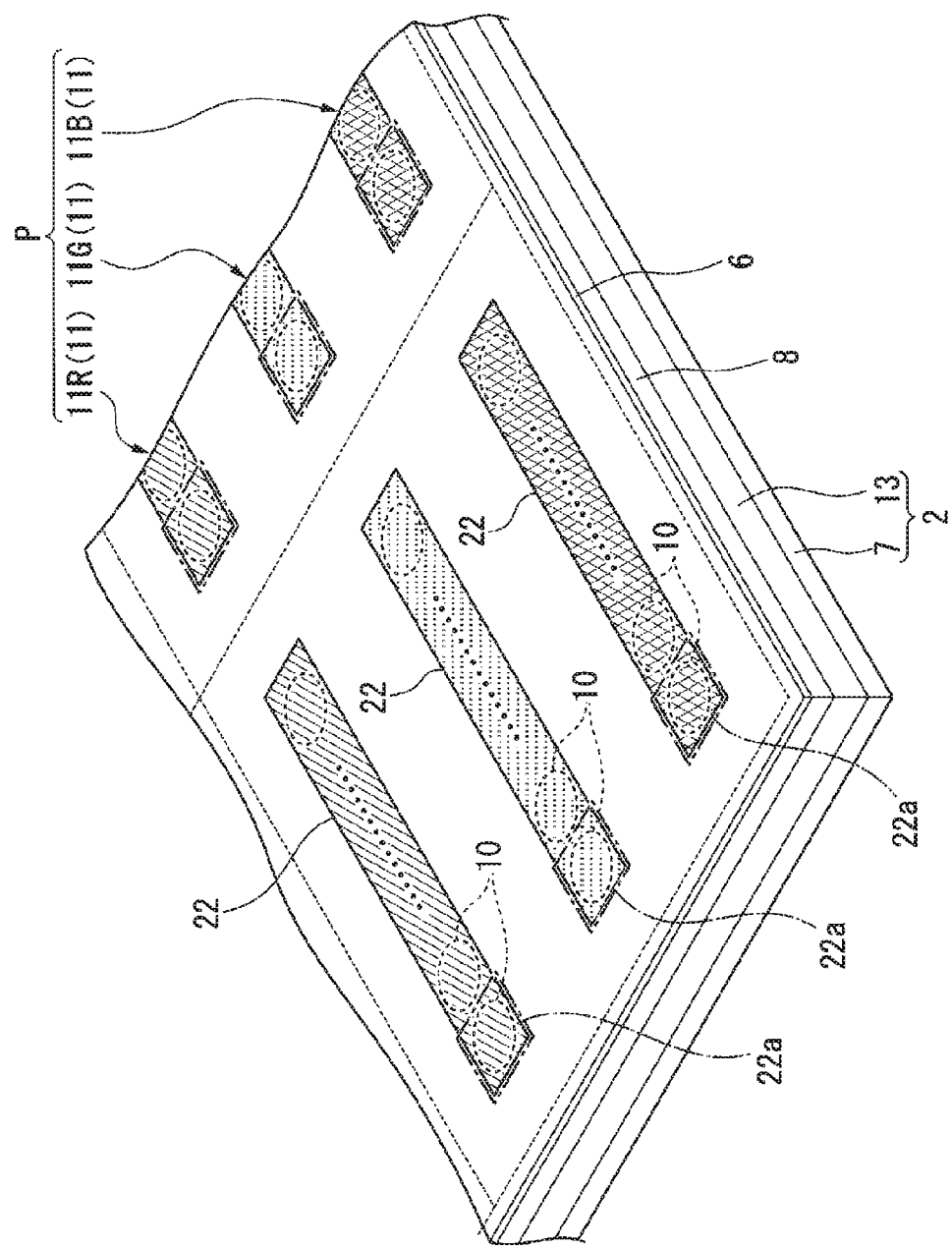
FIG. 2 is a magnified perspective view illustrating a portion of the organic EL device of the first embodiment and is a perspective view of the organic EL device of the first embodiment.

FIG. 1 is a magnified plan view illustrating a portion of the organic EL device of the first embodiment. FIG. 2 is a magnified perspective view illustrating a portion of the organic EL device of the first embodiment.

As illustrated in FIG. 1, the organic EL device 1 (organic electroluminescence device, illumination device, and display device) is a display device including a display region E in which a plurality of pixels P are arranged in a matrix. Each pixel P is composed of three RGB sub-pixels (unit regions) 11 arranged sequentially from left to right in the display region E. The red sub-pixel 11R emits red light; the green sub-pixel 11G emits green light; and the blue sub-pixel 11B emits blue light. The red sub-pixel 11R, the green sub-pixel 11G, and the blue sub-pixel 11B differ only in the constituent materials of the light-emitting layer, and share the same configuration in other respects. The red sub-pixel 11R, the green sub-pixel 11G, and the blue sub-pixel 11B can each be subjected to the application of an electric field (driven) independently.

Note that in this embodiment, a display device in which one pixel P is formed by the three RGB sub-pixels 11R, 11G, and 11B was described, but the disclosure can also be applied to a display device equipped with a pixel P corresponding to each color. In addition, the device can be used as an illumination device configured to produce white light, for example, by emitting red light, green light, and blue light simultaneously.

As illustrated in FIG. 1, from the perspective of the normal direction of the upper face of the organic EL device 1, each individual sub-pixel 11 has a rectangular shape. Further, the planar shape of one pixel P is a square, and the height/width L of one edge of the square is, for example, 100 μm.

Although omitted from illustrated in FIGS. 1 and 2, a plurality of data lines and a plurality of scanning lines are provided intersecting one another on the base material 7, and one sub-pixel 11 is provided in regions surrounded by mutually adjacent data lines and mutually adjacent scanning lines. Each sub-pixel 11 is provided with a thin film transistor configured to control the light emission of the organic EL element 10. The thin film transistor will be described below.

In this embodiment, an organic EL element (light-emitting element) 10 is provided for each sub-pixel 11.

The organic EL elements 10 are formed in a plurality of recessed portions 9 having a circular planar shape. The plurality of recessed portions 9 are arranged over roughly the entire region of the sub-pixels 11. The diameter φ of each recessed portion 9 is, for example, from 5 to 7 μm. Note that the planar shape of the recessed portion is not limited to a circle and may be another shape.

In the known art, a light-emitting region 22 (organic EL element) is formed on a thin film transistor excluding the region over the contact portion, while in each sub-pixel 11 in the present embodiment, a light-emitting region 22 includes the contact region 22a of the thin film transistor. Therefore, the light-emitting region 22 is expanded in comparison to cases in the known art.

Figure 3A:
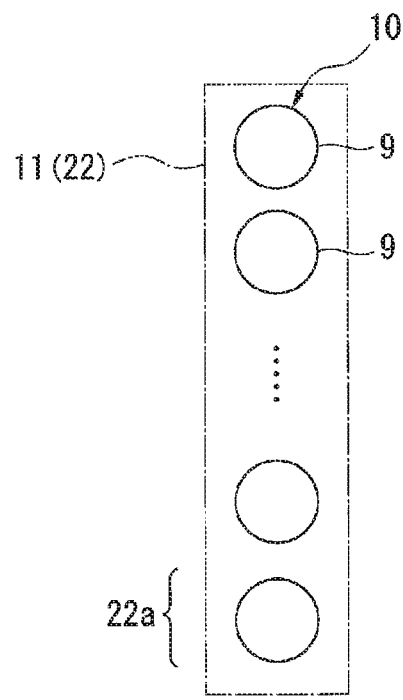
FIG. 3A is a plan view of a sub-pixel in the first embodiment.
Figure 3B:
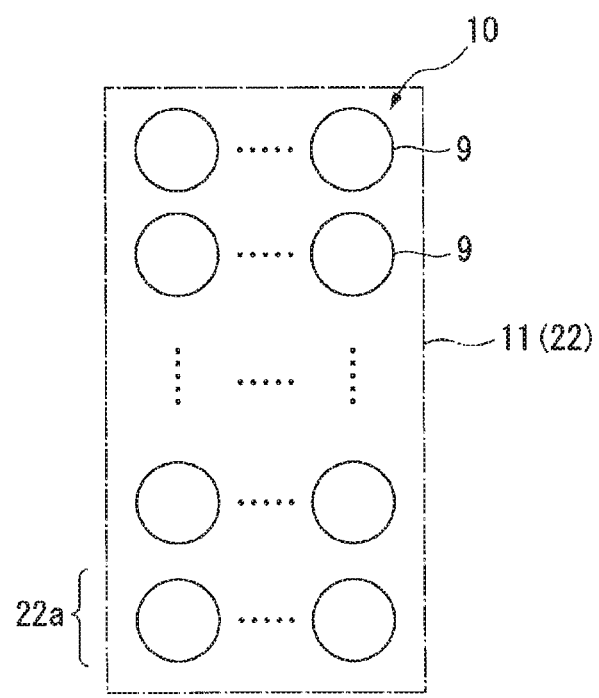
FIG. 3B is a plan view illustrating a modified example of a sub-pixel in the first embodiment.

FIG. 3A is a plan view illustrating a sub-pixel in the first embodiment, and FIG. 3B is a plan view illustrating a modified example of the sub-pixel.

As illustrated in FIG. 3A, in the present embodiment, a plurality of recessed portions 9 forming an organic EL element 10 are arranged in a row for each sub-pixel 11. As illustrated in FIG. 3B, the width of the sub-pixel 11 may be expanded such that a plurality of recessed portions 9 may be arranged both vertically and horizontally.

Figure 4:
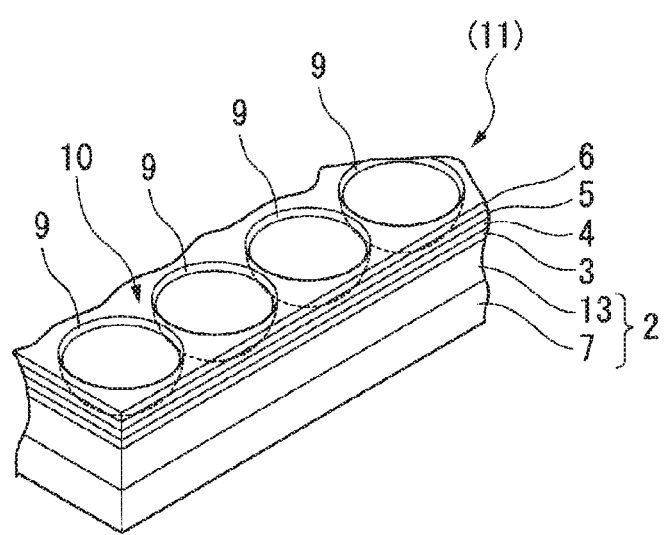
FIG. 4 is a perspective view in which, in the configuration of the organic EL device of the first embodiment, the organic EL device is cut along a given plane perpendicular to the upper face of the base material.

FIG. 4 is a perspective view in which, in the configuration of the organic EL device of the first embodiment, the organic EL device is cut along a given plane perpendicular to the upper face of the base material.

As illustrated in FIG. 4, the organic EL device 1 of this embodiment includes a TFT array substrate 2 and an organic EL element 10 provided for each sub-pixel 11. Specifically, the TFT array substrate 2 includes a base material 7 and a TFT layer 13. The organic EL element 10 is formed on a plurality of recessed portions 9 formed in the TFT layer 13, and the organic EL element 10 includes a reflective electrode (reflective layer) 3, a filling layer 12, a first electrode 4, an organic layer 5 including a light-emitting layer, and a second electrode 6. The organic EL device 1 is a top-emitting organic EL device in which light emitted from the light-emitting layer is emitted from the second electrode 6 (light-emitting face) side.

Figure 5A:
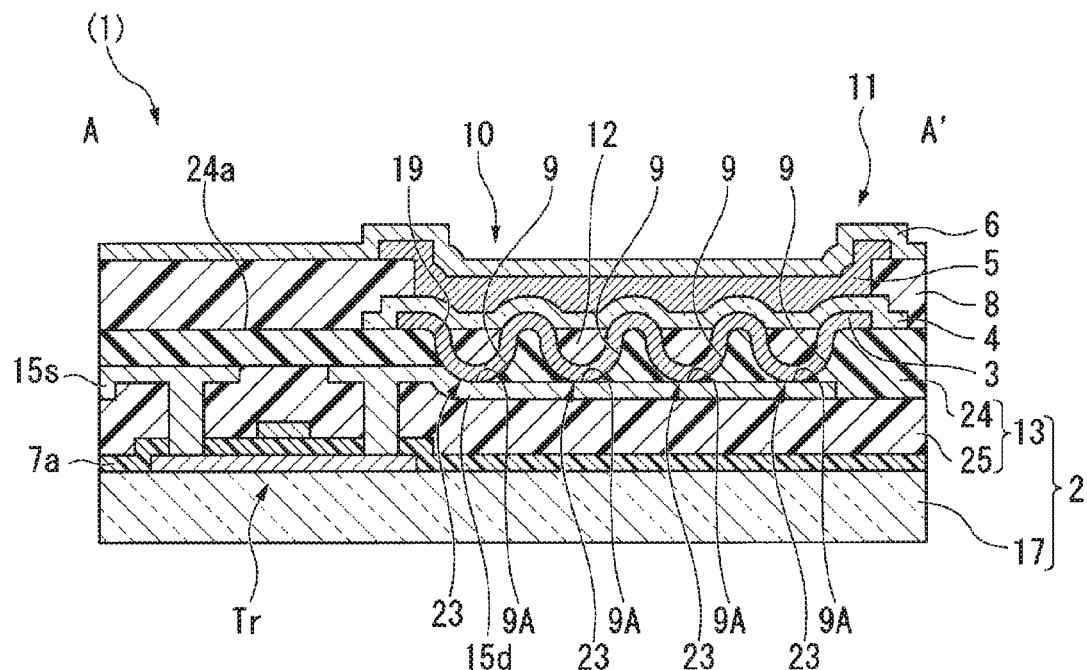
FIG. 5A is a partially magnified cross-sectional view of one sub-pixel in the first embodiment.

FIG. 5A is a partially magnified cross-sectional view of one sub-pixel in the first embodiment, and is a cross-sectional view along line A-A' in FIG. 1.

Figure 6A:
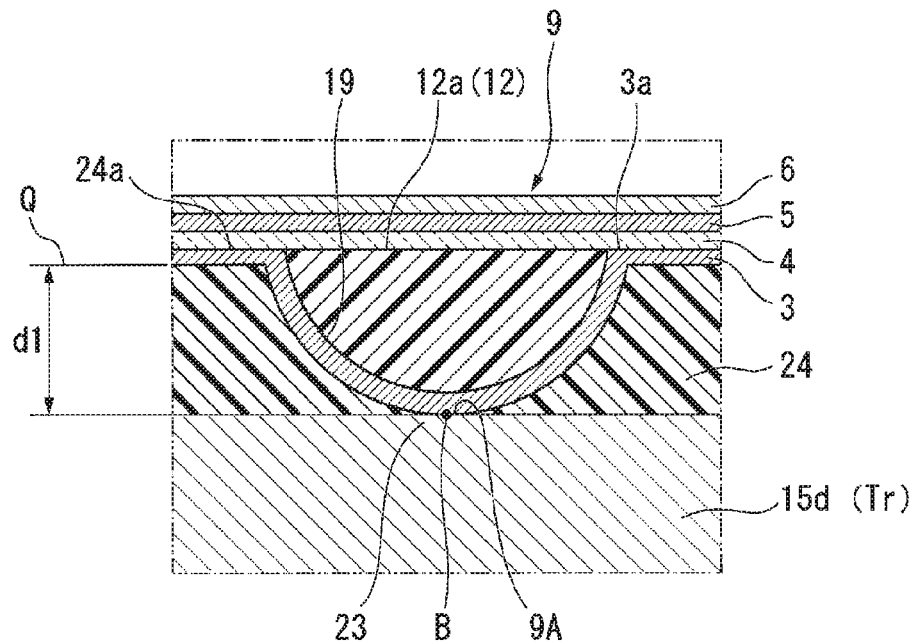
FIG. 6A is a partially magnified cross-sectional view of one recessed portion of the organic EL element in the first embodiment.
Figure 6B:
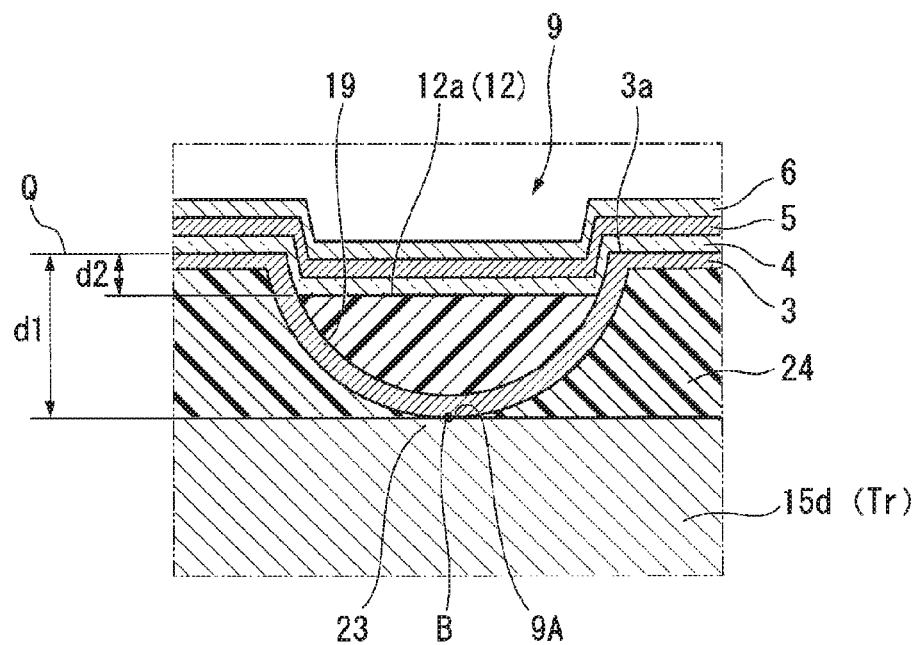
FIG. 6B is a cross-sectional view illustrating a modified example of the organic EL element of the first embodiment.

FIG. 6A is a partially magnified cross-sectional view of one recessed portion of the organic EL element in the first embodiment. FIG. 6B is a cross-sectional view illustrating a modified example of the organic EL element.

As illustrated in FIG. 5A, the TFT layer 13 is layered onto an upper face 7a of the base material 7. A glass substrate, for example, is employed as the base material 7. Note that since the organic EL device 1 is a top-emitting organic EL device, the base material 7 does not necessarily need to have optical transparency, and, for example, a semiconductor substrate such as a silicon substrate may be employed.

The IFT layer 13 includes a thin film transistor (active element) Tr arranged in an array, various types of signal wiring lines (e.g., drain electrode 15*d*, source electrode 15*s*) for driving the thin film transistor Tr, and a protection film 24 formed on the upper layer of the thin film transistor Tr. The thin film transistor Tr may be formed by a known technique, and the disclosure is unaffected by the type or structure of the thin film transistor Tr.

The protection film 24 is formed from an inorganic material. A plurality of recessed portions 9 which open upward are provided in the protection film 24. The cross-sectional shape of the recessed portions 9 is an arc shape. That is, the inner peripheral surface (front surface) 19 of each recessed portion 9 forms part of a three-dimensional spherical surface. In the present embodiment, the recessed portion shape is preferably a parabola shape.

The protection film 24 is formed from a photosensitive resin such as an acrylic, an epoxy, or a polyimide resin. Employing a photosensitive resin for the material of the protection film is well-suited to the method for forming the recessed portions 9 described later. However, when a method other than the forming method described later is applied, the constituent material of the protection film 24 is not necessarily be photosensitive.

A flattening film 8, which is formed from an organic material, is formed to flatten the thin film transistor Tr and to divide the sub-pixels 11.

The reflective electrode 3 is formed on the upper face 24*a* of the protection film 24 including the inner peripheral surfaces 19 of the recessed portions 9. A metal having high reflectance such as aluminum or silver is preferably used as the constituent material of the reflective electrode 3. In the case of the present embodiment, the reflective electrode 3 is formed from, for example, an aluminum film having a film thickness of 100 nm.

In this embodiment, an opening 9A is formed at the base of each recessed portion 9, and a drain electrode 15*d* of the thin film transistor Tr on the lower layer side is partially exposed through the opening 9A. Thus, the reflective electrode 3 formed inside the recessed portion 9 and the drain electrode 15*d* are electrically connected via the opening 9A.

A filling layer 12 is filled into the inside of each of the recessed portions 9 with the reflective electrode 3 interposed therebetween. The refractive index of the filling layer 12 is the same as the refractive index of the main component material of the light-emitting layer described below. In this embodiment, the refractive index of the filling layer 12 is 1.6.

As illustrated in FIG. 6A, an upper face 12*a* of the filling layer 12 in this embodiment is located at the same position as a plane Q including an upper face 3*a* of the reflective electrode 3, and is not formed to rise above the plane Q.

The height from the lowest part B of each recessed portion 9 to the upper face 3*a* of the reflective electrode 3 is defined as d1. A specific example of the height d1 will be described below.

Although the upper face 12*a* of the filling layer 12 is preferably positioned lower than the plane Q including the upper face 3*a* of the reflective electrode 3, even when the upper face 12*a* of the filling layer 12 is at the highest position, the position of the upper face 12*a* of the filling layer 12 would only need to be at the same height as the plane Q. In other words, the filling layer 12 is not formed to rise above the plane Q.

Alternatively, as illustrated in FIG. 6B, the upper face 12*a* of the filling layer 12 may be formed at a lower position than the plane Q including the upper face 3*a* of the reflective electrode 3. In this case, the height from the upper face 12*a* of the filling layer 12 to the upper face 3*a* of the reflective electrode 3 is defined as d2. The height d2 is set to 0.1 mm, for example.

The first electrode 4 is formed across the upper face 12*a* of the filling layer 12 and the upper face 3*a* of the reflective electrode 3. The first electrode 4 includes a step in the portion at the edge of the recessed portion 9. A portion of the first electrode 4 positioned on the upper face 8*a* of the flattening film 8 is in contact with a portion of the reflective electrode 3. The lower face of the first electrode 4 is in contact with the upper face 12*a* of the filling layer 12 at a position inside the recessed portion 9. Accordingly, the lower face of the first electrode 4 is at a lower position than the plane Q including the upper face 3*a* of the reflective electrode 3.

The first electrode 4 is a transparent electrode formed from a layered film of a transparent conductive film such as indium tin oxide (ITO) or indium zinc oxide (IZO), and a metal thin film, and has optical transparency and optical reflectivity. In the case of the present embodiment, the first electrode 4 is formed from, for example, ITO having a film thickness of 120 nm and a metal thin film such as Al or Ag. The first electrode 4 functions as a positive electrode for injecting holes into the organic layer. Note that the first electrode 4 may also be formed from a transparent electrode film.

The organic layer 5 is layered across the upper face of the first electrode 4. The organic layer 5 mirrors the shape of the first electrode 4 and includes a step in the portion at the edge of the recessed portion 9. The organic layer 5 is a layered body formed from an organic material. The organic layer 5 includes a hole injecting layer, a hole transport layer, a light-emitting layer, an electron transport layer, and an electron injecting layer. The lower face of the organic layer 5 is positioned lower than the plane Q including the upper face 3*a* of the reflective electrode 3. A detailed description of the configuration and functioning of each layer configuring the organic layer 5 is given later.

The second electrode 6 is layered across the upper face of the organic layer 5. The second electrode 6 mirrors the shape of the organic layer 5 and includes a step in the portion at the edge of the recessed portion 9. The second electrode 6 is a transparent electrode formed from a transparent conductive film such as indium tin oxide (ITO) or indium zinc oxide (IZO), and has optical transparency. In the case of the present embodiment, the second electrode 6 is formed from, for example, ITO having a film thickness of 120 nm. The second electrode 6 functions as a negative electrode for injecting electrons into the organic layer 5.

In this embodiment, the region sandwiched between the first electrode 4 and the second electrode 6 forms a microcavity structure. Light emitted from the light-emitting layer undergoes multiple reflection between the first electrode 4 and the second electrode 6. At this time, specific wavelength components of the light emitted from the light-emitting layer are intensified. Moreover, although omitted from the illustration, an optical adjustment layer known as a cap layer is layered onto the upper face of the second electrode 6.

In the configuration of the organic EL device 1 of this embodiment, the reflective electrode 3 provided in each recessed portion 9 and the drain electrode 15*d* of the thin film transistor Tr are electrically connected via the opening 9A formed in the plurality of recessed portions 9 in the sub-pixel 11. That is, a portion of the reflective electrode 3 exposed through each opening 9A functions as a contact portion 23 with the drain electrode 15*d*.

Figure 5B:
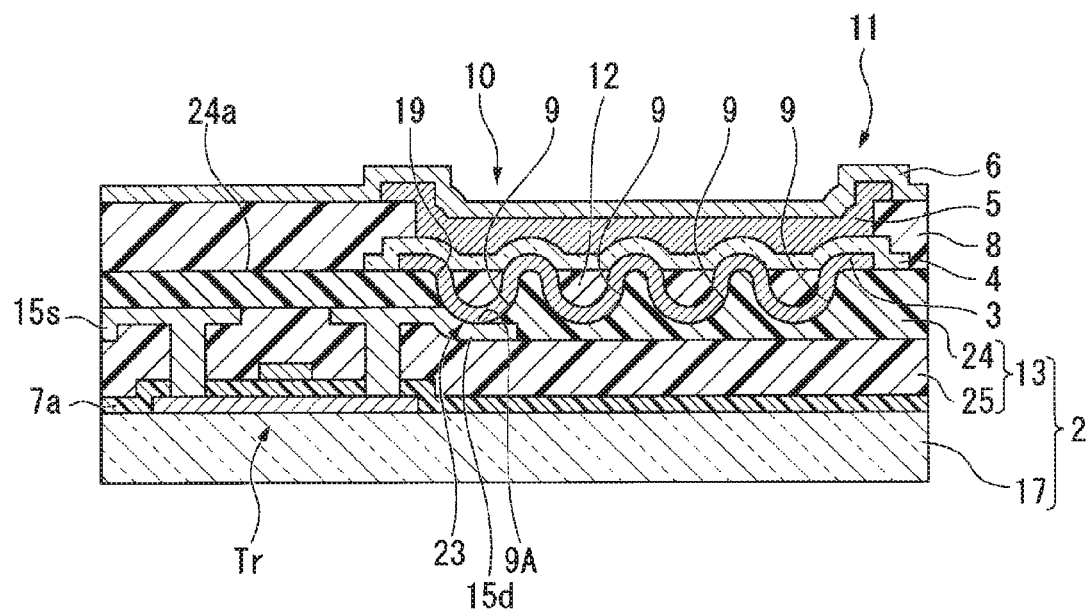
FIG. 5B is a cross-sectional view illustrating a modified example of the first embodiment.

Note that the disclosure is not limited to the configuration of this embodiment. For example, as illustrated in FIG. 5B, an opening 9A may be formed in at least one of the plurality of recessed portions 9 in the sub-pixel 11, and the reflective electrode 3 and the drain electrode 15d may be electrically connected via the opening 9A.

Figure 7:
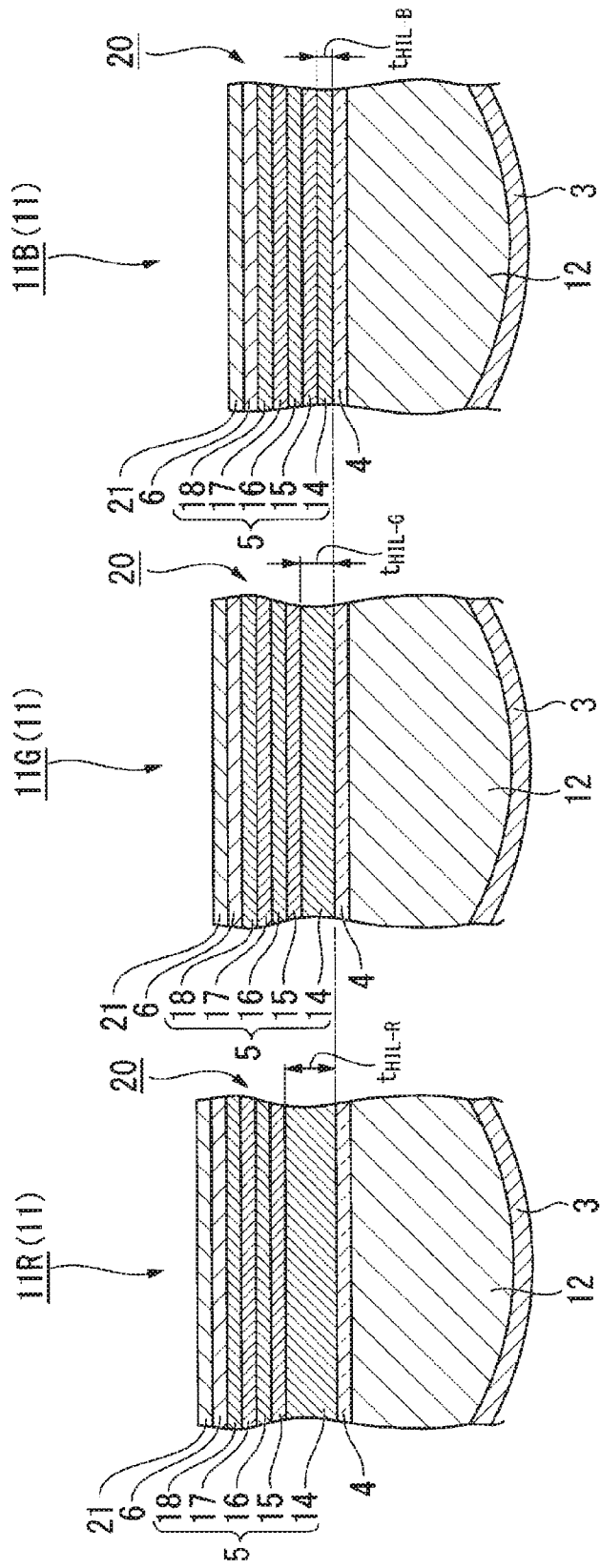
FIG. 7 is a cross-sectional view illustrating the details of the recessed portion structure.

FIG. 7 is a cross-sectional view illustrating the details of the recessed portion structure.

FIG. 7 is a magnified view of the structure of one of the plurality of recessed portions forming the organic EL element 10.

In addition, the recessed portion structure of the organic EL elements 10 of the three sub-pixels 11R, 11G, and 11B differ only in the film thickness of the hole injecting layer, and the same basic configuration is shared.

As illustrated in FIG. 7, in the recessed portion structure, the organic layer 5 is provided on the first electrode 4. The organic layer 5 is formed from a layered film including a hole injecting layer 14, a hole transport layer 15, a light-emitting layer 16, an electron transport layer 17, and an electron injecting layer 18 layered from the first electrode 4 side thereof. However, layers other than the light-emitting layer 16 may be appropriately introduced as necessary. In addition, a single layer may serve as both a transport layer and an injecting layer. In the present embodiment, as described above, an example is given of an organic layer having a 5-layer structure of the hole injecting layer 14, the hole transport layer 15, the light-emitting layer 16, the electron transport layer 17, and the electron injecting layer 18. Moreover, as necessary, a layer for preventing migration of charge to the opposite side electrode, such as a hole blocking layer or an electron blocking layer, may be appropriately added.

The hole injecting layer 14 is a layer that functions to increase the efficiency of injecting holes from the first electrode 4 to the light-emitting layer 16. Examples that may be employed as the material of the hole injecting layer 14 include benzine, styrylamine, triphenylamine, porphyrin, triazole, imidazole, oxadiazole, polyarylalkane, phenylene diamine, arylamine, oxazole, anthracene, fluorenone, hydrazone, stilbene, triphenylene, azatriphenylene, and derivatives thereof; and heterocyclic, conjugated monomers, oligomers, polymers, and the like of an polysilane-based compound, a vinylcarbazole-based compound, a thiophene-based compound, an aniline-based compound, or the like. Molybdenum oxide may be blended with these organic materials. The blending ratio of the organic material and the molybdenum oxide is, for example, approximately 80% organic material, and approximately 20% molybdenum oxide.

The hole transport layer 15 is a layer that functions to increase the efficiency of hole transport from the first electrode 4 to the light-emitting layer 16. An organic material similar to the hole injecting layer 14 may be employed for the hole transport layer 15. Note that the hole injecting layer 14 and the hole transport layer 15 may be a single body, or may be formed as individual layers.

The light-emitting layer 16 functions to emit light when holes injected from the first electrode 4 side recombine with electrons injected from the second electrode 6 side and the holes and the electrons release energy. The material of the light-emitting layer 16 is configured by, for example, a host material and a dopant material. The material of the light-emitting layer 16 may also include an assist material. The host material is included at the highest ratio among the constituent materials in the light-emitting layer 16. For example, the blending ratio of the host material and the dopant material is approximately 90% host material and approximately 10% dopant material. The host material facilitates formation of the light-emitting layer 16 and functions to maintain the film state of the light-emitting layer 16. Accordingly, it is desirable that the host material is a stable compound that does not easily crystalize after film formation and does not easily undergo chemical change. Moreover, when an electric field is applied between the first electrode 4 and the second electrode 6, the host material functions such that recombination of carriers occurs within the host molecules, and excitation energy is transferred to the dopant material, causing the dopant material to emit light. The thickness of the light-emitting layer 16 is, for example, approximately 60 nm.

Specific examples of materials of the light-emitting layer 16 include materials that include a material having a high light-emission efficiency, such as a low-molecular fluorescent colorant, a fluorescent macromolecule, or a metal complex. Examples of the material of the light-emitting layer 16 include anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, and derivatives thereof; tris(8-quinolinato)aluminum complex; bis(benzoquinolinato)beryllium complex; tri(dibenzoylmethyl)phenanthroline europium complex; and ditoluylvinylbiphenyl.

The electron transport layer 17 functions to increase the efficiency of electron transport from the second electrode 6 to the light-emitting layer 16. As the material of the electron transport layer 17, for example, quinoline, perylene, phenanthroline, bisstyryl, pyrazine, triazole, oxazole, oxadiazole, fluorenone, and derivatives and metal complexes thereof can be employed. Specifically, for example, tris(8-hydroxyquinoline)aluminum, anthracene, naphthalene, phenanthrene, pyrene, anthracene, perylene, butadiene, coumarin, acridine, stilbene, 1,10-phenanthroline, and derivatives and metal complexes thereof can be employed. The thickness of the electron transport layer 17 is, for example, approximately 15 nm.

The electron injecting layer 18 functions to increase the efficiency of electron injection from the second electrode 6 to the light-emitting layer 16. As the material of the electron injecting layer 18, for example, compounds such as calcium metal (Ca) or lithium fluoride (LiF) can be employed. Note that the electron transport layer 17 and the electron injecting layer 18 may be a single body, or may be formed as individual layers. The thickness of the electron injecting layer 18 is, for example, approximately 0.5 nm.

The microcavity structure 20 has an effect of intensifying light of a specific wavelength by utilizing the resonance of light occurring between the first electrode 4 and the second electrode 6. In the case of this embodiment, the wavelength of light emitted from each of the red, green, and blue sub-pixels 11R, 11G, and 11B differs from one another. Therefore, the optical path length between the first electrode 4 and the second electrode 6 corresponds to the light emission spectrum peak wavelength of each color. Each optical path length is set such that the optical path length of the red sub-pixel 11R is the longest, the optical path length of the blue sub-pixel 11B is the shortest, and the optical path length of the green sub-pixel 11G is an intermediate length therebetween.

There are various techniques for varying each of the optical path lengths of the microcavity structure 20 for each of the sub-pixels 11R, 11G, and 11B. Here, a technique of varying the length of the hole injecting layer 14 is employed from the perspective of minimizing the effects on resistance. When the layer thickness of the hole injecting layer 14 of the red sub-pixel 11R is defined as tHIL-R, the layer thickness of the hole injecting layer 14 of the green sub-pixel 11G is defined as tHIL-G, and the layer thickness of the hole injecting layer 14 of the blue sub-pixel 11B is defined as tHIL-B, the relationship tHIL-R>tHIL-G>tHIL-B holds, for example.

Light emitted from the organic layer 5 due to the microcavity structure 20 is repeatedly reflected between the first electrode 4 and the second electrode 6 within a prescribed optical length range. Light of a prescribed wavelength corresponding to the optical path length resonates and is intensified, while light of wavelengths not corresponding to the optical path length is weakened. As a result, the spectrum of light extracted to the outside becomes steep and high-intensity, and the luminance and color purity are enhanced.

For the constituent materials of the light-emitting layer 16, a light-emitting material which emits red light may be used for the red sub-pixel 11R, a light-emitting material which emits green light may be used for the green sub-pixel 11G, and a light-emitting material which emits blue light may be used for the blue sub-pixel 11B. In the case of this embodiment, a bipolar material is used for the host material in each of the unit regions.

For dopant materials, a phosphorescent material is used for the red sub-pixel 11R, and the green sub-pixel 11G, and a fluorescent material is used for the blue sub-pixel 11B. The thickness of the light-emitting layer 16 is approximately 60 nm in the red sub-pixel 11R and the green sub-pixel 11G, for example, and approximately 35 nm in the blue sub-pixel 11B, for example.

Alternatively, the same light-emitting material which emits white light may be used for all of the light-emitting areas U of the red sub-pixel 11R, the green sub-pixel 11G, and the blue sub-pixel 11B. In this case as well, as a result of light of different wavelengths depending on each of the sub-pixels 11R, 11G, and 11B resonating and being amplified, red light is emitted from the red sub-pixel 11R, green light is emitted from the green sub-pixel 11G, and blue light is emitted from the blue sub-pixel 11B.

A cap layer 21 is layered onto the upper face of the second electrode 6. The cap layer 21 functions as a protective layer protecting the second electrode 6 and functions as an optical adjustment layer. Note that a color filter may be added at an upper-layer side of the second electrode 6. The color filter transmits light emitted from the organic layer 5, enabling the color purity to be raised.

One example of a specific configuration of the organic EL device 1 of this embodiment is given in Table 1.

TABLE 1

| | Green |
|---|---|
| ITO: 120 nm | ITO: 120 nm |
| HIL | 70 nm |
| Organic HTL material (80%):MoOx (20%) | |
| HTL organic HTL material | 10 |
| EML | H(90%):d(10%) |
| | 60 nm |
| | H: bipolar material |
| | d: phosphorescent material |
| ETL organic ETL material | 15 nm |
| EIL LiF | 0.5 nm |
| Cathode (translucent electrode) | MgAg 1 nm/Ag 19 nm |
| Cap layer | 78 nm |

A process for producing the organic EL device 1 having the above configuration will be described hereinafter.

FIGS. 8A to 8E and FIGS. 9A to 9D illustrate a production process for the organic EL device of the first embodiment.

First, a TFT array substrate 2 is formed.

Figure 8A:
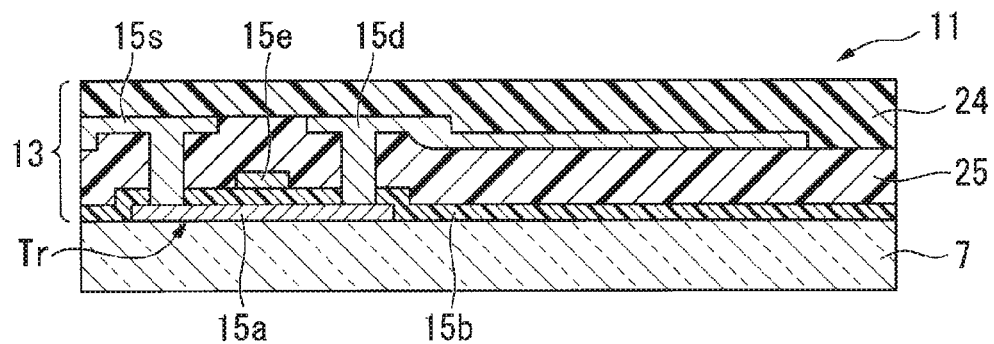
FIG. 8A is a first drawing illustrating the production process of the organic EL device of the first embodiment.

As illustrated in FIG. 8A, a TFT layer 13 including a thin film transistor Tr or the like is formed on a base material 7. The thin film transistor Tr is formed using a known method and is not particularly limited.

The thin film transistor Tr of this embodiment is a low-temperature polysilicon TFT, wherein a low-temperature polysilicon layer 15a, a gate insulating film 15b and a gate electrode 15e, and an interlayer insulating film 25 made of silicon nitride (SiNx) and silicon oxide ($SiO_2$) are sequentially formed on a base material 7. Further, wiring lines for the thin film transistor Tr (drain electrode 15d and source electrode 15s) are formed on the interlayer insulating film 25 in a prescribed pattern. Silicon nitride film is formed as a protection film 24 on the thin film transistor Tr by a known CVD method such that the film thickness is 500 nm.

Here, the drain electrode 15d of the thin film transistor Tr is formed over roughly the entire region of the sub-pixel 11. In this embodiment, since the reflective electrode 3 of the organic EL element 10 is configured to function as a contact portion of the thin film transistor Tr, the drain electrode 15d was formed over the entire region of the sub-pixel 11. However, it may also be formed to be smaller than the sub-pixel region.

Figure 8B:
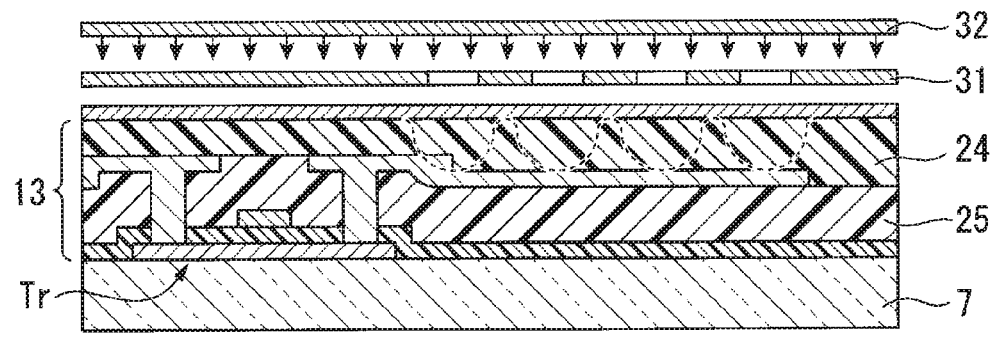
FIG. 8B is a second drawing illustrating the production process of the organic EL device of the first embodiment.

Next, as illustrated in FIG. 8B, after a photoresist is applied with a spin coating method, a photomask 31 is used to perform pattern exposure with an UV exposure device 32. The photoresist 34 is formed using a commercially available general-purpose product such that the thickness is 2 μm after pre-baking.

Figure 8C:
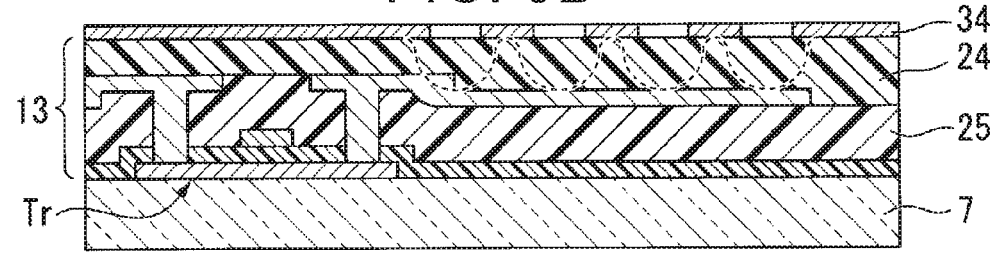
FIG. 8C is a third drawing illustrating the production process of the organic EL device of the first embodiment.

The product is then developed with an alkaline developing solution with a concentration of a few %, as illustrated in FIG. 8C.

Figure 8D:
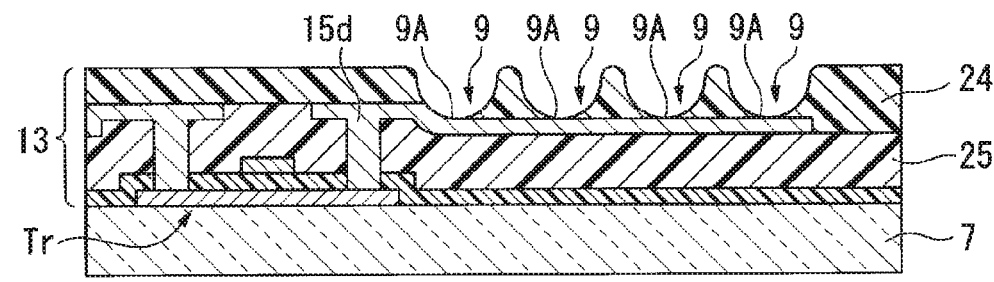
FIG. 8D is a fourth drawing illustrating the production process of the organic EL device of the first embodiment.

Then, as illustrated in FIG. 8D, etching is performed with 1:10 buffered hydrofluoric acid for 250 to 350 seconds using a shower method. After the photoresist 34 (FIG. 8C) is then removed with a resist stripper, the substrate is washed and dried, forming a recessed portion. At this time, an opening 9A is formed at the base of each recessed portion 9, and a portion of the drain electrode 15d of the thin film transistor Tr is exposed through each opening 9A.

In this way, a TFT layer 13 including a plurality of recessed portions 9 is obtained for each sub-pixel 11.

Next, an organic EL element 10 is formed in each of the plurality of recessed portions 9 provided for each sub-pixel 11 on the TFT layer 13.

Figure 8E:
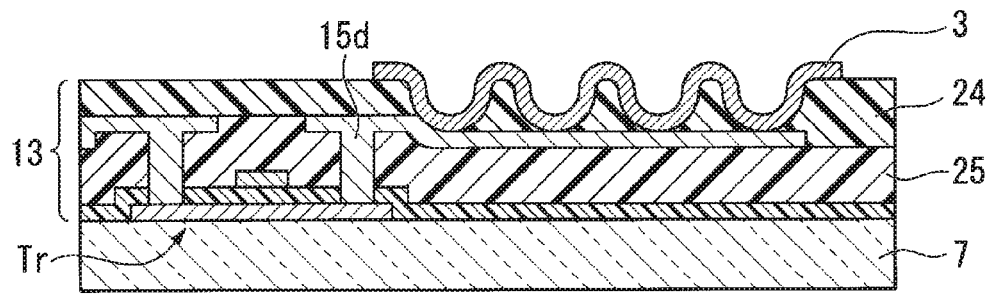
FIG. 8E is a fifth drawing illustrating the production process of the organic EL device of the first embodiment.

First, as illustrated in FIG. 8E, a reflective electrode 3 is formed over the plurality of recessed portions 9 formed on the TFT layer 13. The reflective electrode 3 is obtained by forming an aluminum (Al) film with a thickness of 100 nm with a prescribed pattern by a known method. After an Al film is formed with a thickness of 100 nm and a photoresist is applied by a known sputtering method, the product is exposed and developed and then etched for 2 minutes with a phosphoric acid-based etching solution. The resist is then removed with a stripper. As a result, a reflective electrode 3 is formed for each sub-pixel 11.

Here, the reflective electrode 3 is preferably formed with a size including the sub-pixel region and is formed to the perimeter of the sub-pixel region.

Figure 9A:
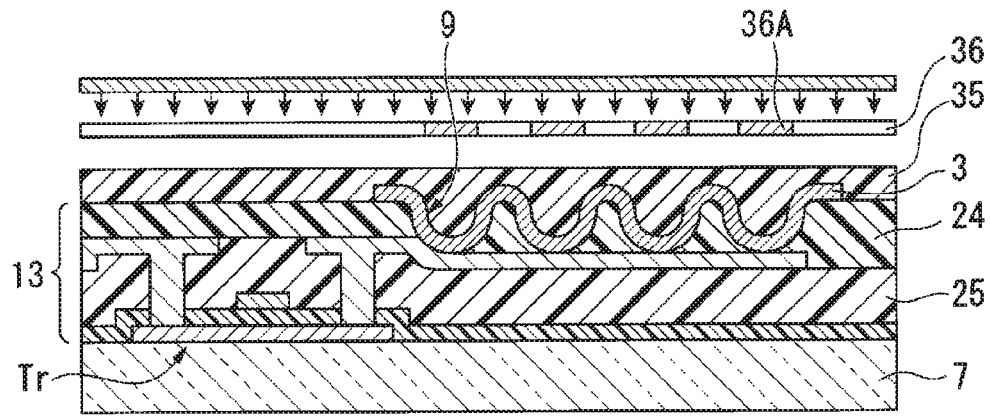
FIG. 9A is a sixth drawing illustrating the production process of the organic EL device of the first embodiment.
Figure 9B:
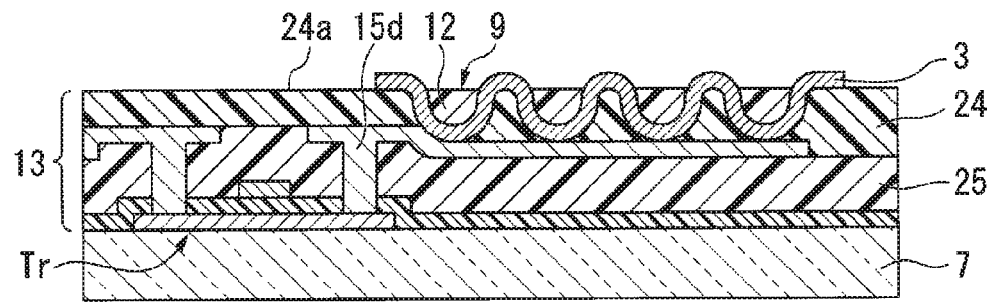
FIG. 9B is a seventh drawing illustrating the production process of the organic EL device of the first embodiment.

Next, as illustrated in FIG. 9A, a photosensitive acrylic resin is applied with a spin coating method to the protection film 24 including the reflective electrode 3, and the acrylic resin layer 35 is exposed to UV rays using a photomask 36. The thickness of the acrylic resin layer 35 is formed to be 1.0 µm at the point when pre-baking is complete.

The photomask 36 has a pattern which blocks light from the regions corresponding to the recessed portions 9. As a result, at the time of exposure, the acrylic resin layer inside the recessed portions 9 can be prevented from being strongly exposed by the concentration of light in the recessed portions 9, and the filling layer can be prevented from being overdeveloped. Note that a half-tone mask, for example, may be used as the photomask 36. In this embodiment, the diameter of the light blocking portion 36A (black) of the photomask 36 is φ 3 µm.

After the acrylic resin layer 35 is exposed, the acrylic resin layer 35 is developed for 2 minutes with an alkaline developing solution having a concentration of a few %, washed with water, and dried, and the entire base material 7 is then baked in an oven at 200° C. Thus, a filling layer 12 is formed in each of the plurality of recessed portions 9 provided for each sub-pixel 11, resulting in the configuration illustrated in FIG. 9B.

Next, an indium zinc oxide (IZO) film with a thickness of 100 nm is formed as a first electrode 4 made of a transparent electrode to cover the reflective electrode 3. That is, an IZO film is formed with a thickness of 100 nm by a known sputtering method. After the photosensitive photoresist is then applied by a spin coating method, pre-baking is complete. Pattern exposure is then performed using a photomask with a prescribed pattern and an UV exposure device, and after the photoresist is developed, it is etched for 2 to 4 minutes with oxalic acid. The photoresist is then removed with a stripper, washed with water, and dried.

The reflective electrode 3 and the first electrode 4 formed in each recessed portion 9 are electrically connected to one another at an overlapping portion on the upper face 24a of the protection film 24.

Figure 9C:
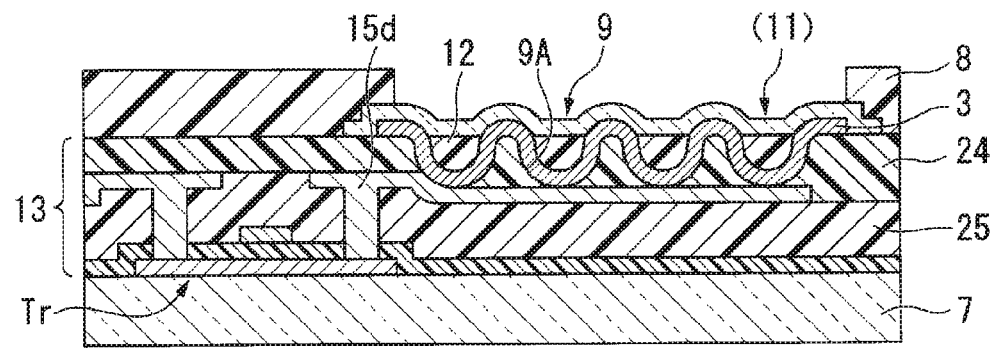
FIG. 9C is an eighth drawing illustrating the production process of the organic EL device of the first embodiment.

Next, an acrylic resin film made of a resin serving as a flattening film 8 is formed as an edge cover material for covering the edges of the first electrode 4. That is, an acrylic resin film is formed by a spin coating method such that the thickness is 3 µm at the point when pre-baking is complete. This resin film is subjected to pattern exposure with a photomask with a prescribed pattern and an UV exposure device and is then developed with an alkaline developing solution having a concentration of a few %. After the film is then washed with water and dried, the film is baked for 1 hour in an oven at 200° C. As a result, a flattening film 8 such as that illustrated in FIG. 9C is formed. In this embodiment, the sub-pixel region (light emission area) is defined by the flattening film 8 as an edge cover of the first electrode 4. In addition, the load capacity of the signal wiring line of the thin film transistor Tr is reduced by the flattening film 8.

Figure 9D:
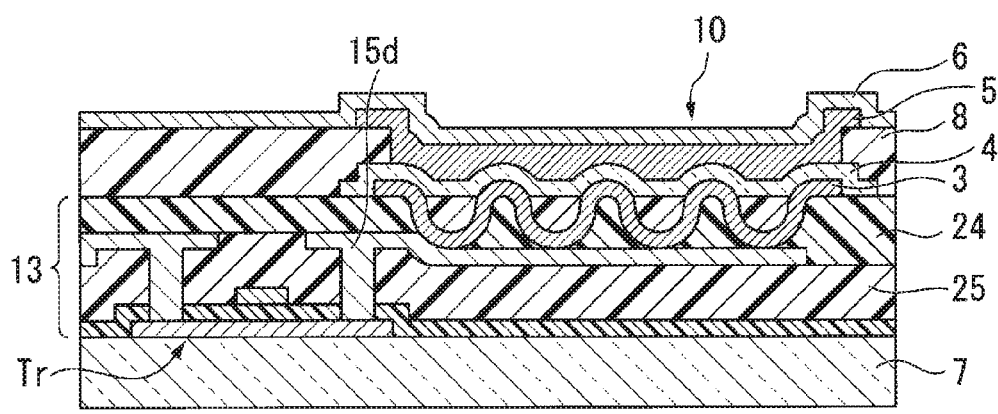
FIG. 9D is a ninth drawing illustrating the production process of the organic EL device of the first embodiment.

Next, as illustrated in FIG. 9D, an organic layer 5 is formed with a configuration such as that illustrated in Table 1 above.

Finally, an indium zinc oxide (IZO) film is formed with a thickness of 100 nm on the upper face of the flattening film 8 to cover the organic layer 5 formed for each sub-pixel 11, and a second electrode 6 is thus formed. In this way, a plurality of organic EL elements 10 are formed for each sub-pixel 11.

The organic EL device 1 of the present embodiment is completed by the process above.

Figure 10:
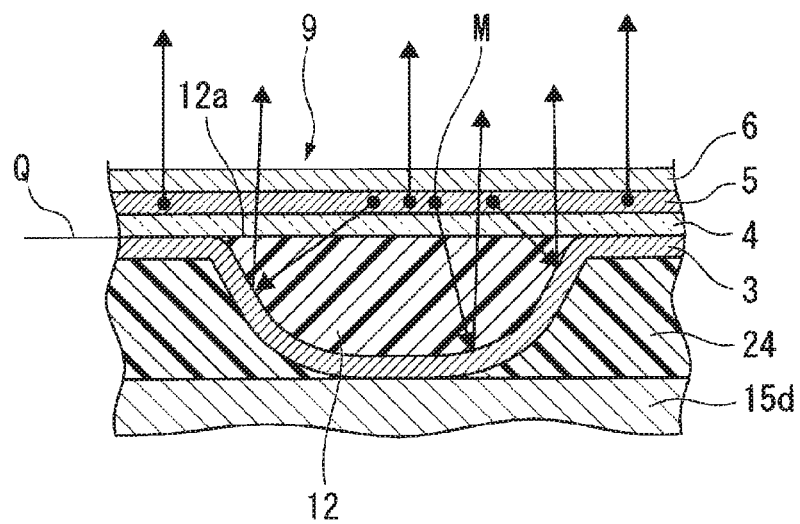
FIG. 10 illustrates an example of an optical path of light propagating through the inside of the organic layer of the organic EL element of the first embodiment.

FIG. 10 illustrates an example of an optical path of light propagating through the inside of the organic layer of the organic EL element of this embodiment.

As illustrated in FIG. 10, in this embodiment, the reflective electrode 3 curves along the recessed portions 9, and thus light reflected by the reflective electrode 3 changes its advancing direction and advances through the inside of the organic EL device 1. At this time, due to having been originally reflected by the reflective electrode 3, light having a large angle of incidence with respect to the interface between the second electrode 6 and the external space (air) is changed to have a smaller angle of incidence than a critical angle at the interface between the second electrode 6 and the external space, and is extracted to the external space.

As a result, after light emitted from the light-emission point M is reflected by the reflective electrode 3 with an arc-shaped cross section, the light can be extracted to the external space at the point when the light is incident at an angle of incidence smaller than a critical angle at the interface between the second electrode 6 and the external space. Thus, an organic EL device 100 exhibiting excellent light utilization efficiency can be provided.

Figure 11:
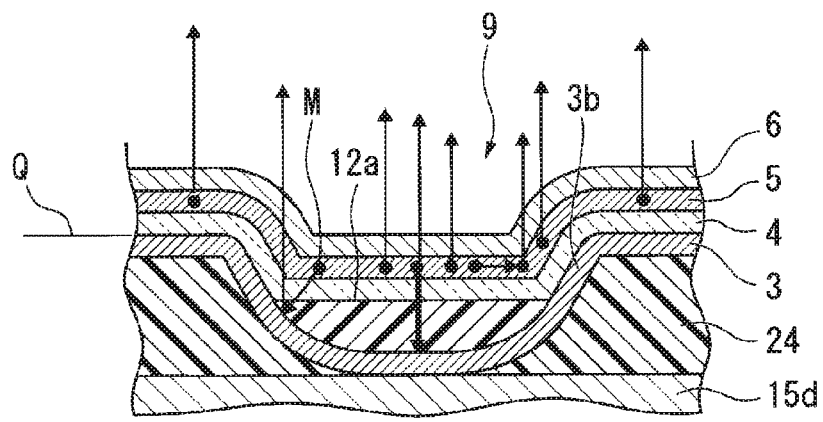
FIG. 11 illustrates an example of an optical path of light propagating through the inside of the organic layer of the organic EL element of a modified example.

FIG. 11 illustrates an example of an optical path of light propagating through the inside of the organic layer of the organic EL element of a modified example.

As illustrated in FIG. 11, in the modified example, the upper face 12a of the filling layer 12 in the recessed portion 9 is at a lower position than the plane Q, and the lower face 5b of the organic layer 5 is at a lower position than the plane Q. In addition, an inclined portion 3b of the reflective electrode 3 positioned on the peripheral edge of the recessed portion 9 is configured to be in contact with the organic layer 5.

Therefore, the reflective electrode 3 is present on the side of the organic layer 5 positioned inside the recessed portion 9, and light emitted to roughly the side from the light-emission point M inside the organic layer 5 is incident on the inclined portion 3b of the reflective electrode 3.

Light that has changed in its advancing direction due to reflection by the inclined portion 3b is emitted to the display surface side.

As a result, even after light emitted to the side from the light-emission point M is reflected by the inclined portion 3b of the reflective electrode 3, the light can be extracted to the external space at the point when the light is incident at an angle of incidence smaller than a critical angle at the interface between the second electrode 6 and the external space. Thus, most of the light emitted from the organic layer 5 into the recessed portion 9 can be extracted to the outside, and therefore an organic EL device exhibiting better light utilization efficiency than a configuration without recessed portions 9 can be provided.

FIGS. 12A to 12D respectively illustrate the planar structure of a sub-pixel 11 in the organic EL device of this embodiment (Examples 1 and 2) and a known organic EL device (Comparative Examples 1 and 2).

Note that the size of one pixel is 100 µm in each case. In addition, in these drawings, the light-emitting regions of each of the RGB sub-pixels 11R, 11G, and 11B are illustrated by different hatching.

Figure 12A:
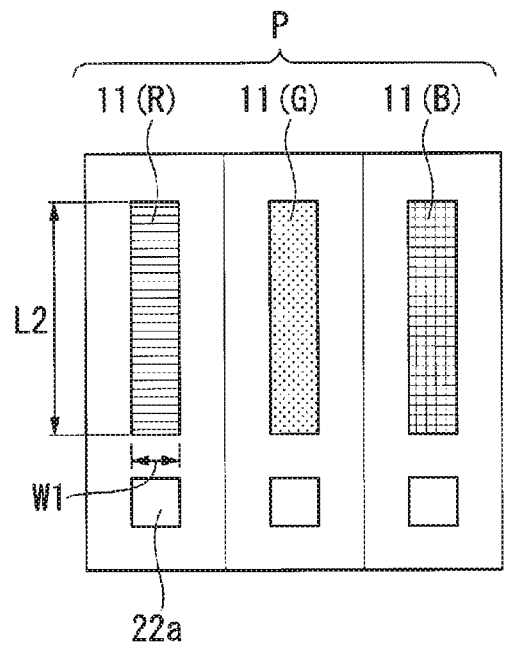
FIG. 12A illustrates the planar structure of a sub-pixel in a known organic EL device (Comparative Example 1).

FIG. 12A illustrates the sub-pixel structure (structure not including a color-coded type contact region 22a) of an organic EL device of Comparative Example 1. The horizontal width W1 of one sub-pixel is 10 µm, and the vertical width L2 is 50 µm.

Figure 12B:
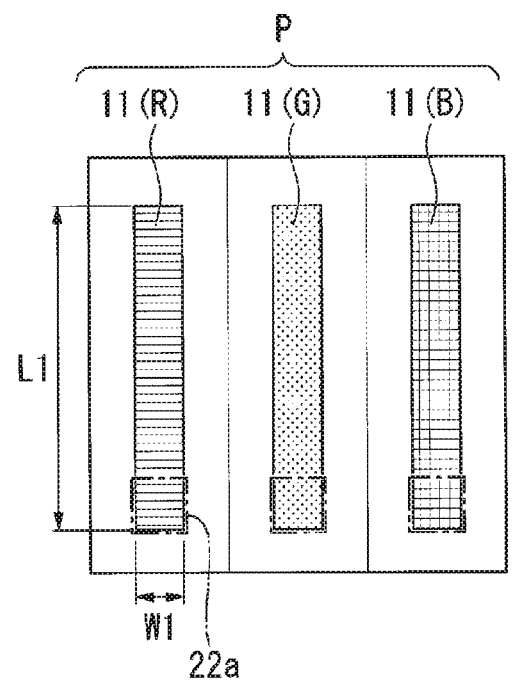
FIG. 12B illustrates the planar structure of a sub-pixel in the organic EL device of this embodiment (Example 1).

FIG. 12B illustrates the sub-pixel structure (structure including a color-coded type contact region 22a) of an organic EL device of Example 1. The horizontal width W1 of one sub-pixel is 10 μm, and the vertical width L1 is 70 μm.

Figure 12C:
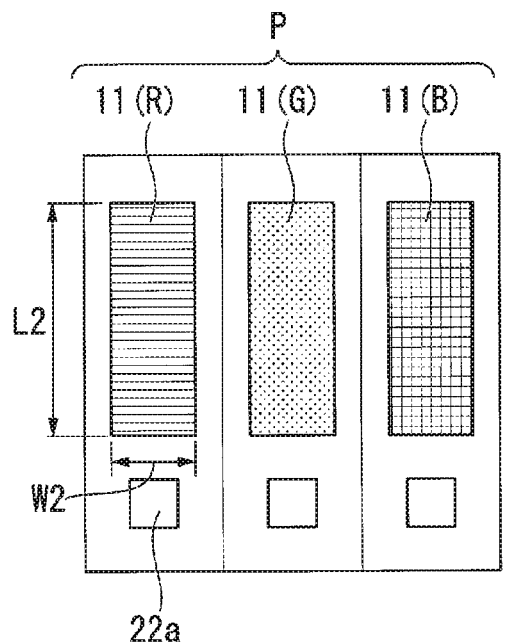
FIG. 12C illustrates the planar structure of a sub-pixel in a known organic EL device (Comparative Example 2).

FIG. 12C illustrates the sub-pixel structure (structure not including a color filter type contact region 22a) of an organic EL device of Comparative Example 2. The horizontal width W2 of one sub-pixel is 20 μm, and the vertical width L2 is 50 μm.

Figure 12D:
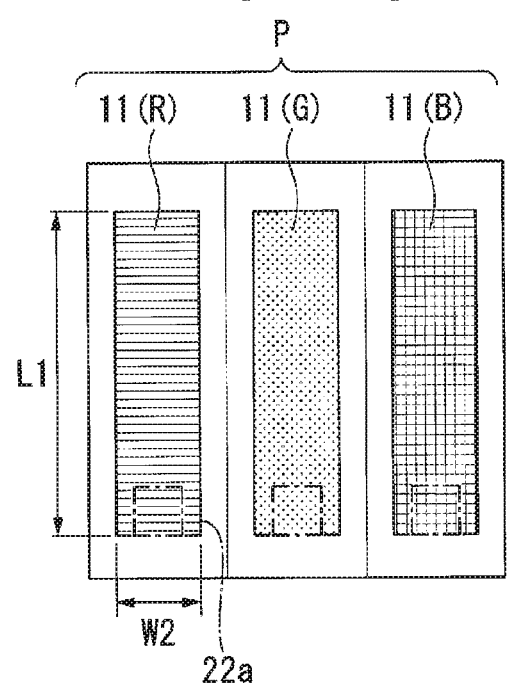
FIG. 12D illustrates the planar structure of a sub-pixel in the organic EL device of this embodiment (Example 2).

FIG. 12D illustrates the sub-pixel structure (structure including a color filter type contact region 22a) of an organic EL device of Example 2. The horizontal width W2 of one sub-pixel is 20 μm, and the vertical width L2 is 70 μm.

In a comparison of the respective configurations in each drawing, the light-emitting regions of the organic EL devices in Examples 1 and 2 are expanded by an amount equal to the portion including the first contact portion over the configurations of Comparative Examples 1 and 2. Further, in Examples 1 and 2, there are a plurality of recessed portion structures over the entire sub-pixel region. That is, a plurality of recessed portion structures are formed as a second contact portion in regions other than the first contact portion. This enables a dramatic improvement in luminance over the configurations of Comparative Examples 1 and 2.

Figure 13:
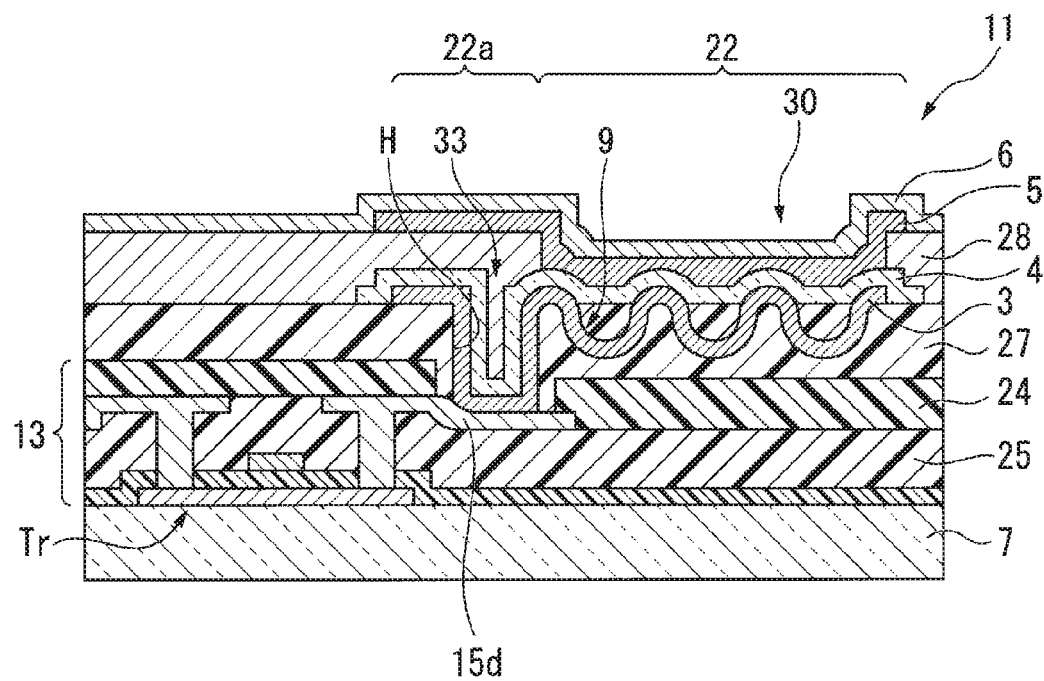
FIG. 13 illustrates the structure of a contact portion in a known organic EL device.

FIG. 13 illustrates the structure of a contact portion in an organic EL device serving as a comparative example.

As illustrated in FIG. 13, in the organic EL device of the comparative example, a thin film transistor Tr, a protection film 24, a flattening film 27, and an edge cover layer 28 are formed on a base material 7 in this order, and an organic EL element 30 is formed on the flattening film 27. The organic EL element 30 is provided in a plurality of recessed portions 9 formed on the flattening film 27. The contact portion 33 includes a tube-shaped contact hole H passing through the flattening film 27 and the protection film 24. The reflective electrode 3 and the first electrode 4 formed on the inside of the contact hole H are electrically connected to the drain electrode 15d of the thin film transistor Tr. The contact hole H is filled with an edge cover layer 28 that is formed on the flattening film 27 to cover the first electrode 4, and no organic layer 5 is provided. Therefore, in the configuration of the comparative example, the light-emitting region 22 does not include the contact region 22a. When the contact hole H is formed to pass through the protection film 24 and the flattening film 27, the concavities and convexities of the surface are large, and thus element failure tends to occur when an organic EL element is formed.

In addition, even in the case where the contact hole H could be flattened by filling with a resin or the like and an organic EL element could be formed, a semicircular arc-shaped recessed portion structure could not be formed, and thus there is no prospect of an improvement in luminance.

In contrast, in the organic EL device 1 of this embodiment, a filling layer 12 is formed inside the arc-shaped recessed portion 9, and an organic EL element 10 is formed in the area of the recessed portion 9 where the steep region of the edge portion disappears. Therefore, there is no step discontinuity of each layer constituting the element or shorting between the electrodes 4 and 6, and element failure is unlikely to occur.

In addition, in this embodiment, multiple recessed portions 9 are formed on the protection film 24 of the TFT layer 13. This eliminates the need to form the edge cover layer 28, as in the configuration of the comparative example illustrated in FIG. 13. As a result, the production processes can be reduced, which enhances throughput or yield.

Further, in this embodiment, a plurality of recessed portions 9 are provided over the entire region of the sub-pixel 11, and the reflective electrode 3 formed in each recessed portion 9 is electrically connected to the drain electrode 15d of the thin film transistor Tr through each opening 9A.

In this embodiment, as illustrated in FIG. 5A, since not one but multiple contact portions 23 are present in the sub-pixel 11, the organic EL element 10 and the thin film transistor Tr can be reliably connected. Therefore, there is no contact failure even in the case where the contact portion 23 is small, and the yield does not decrease even in the case where the contact portion 23 has an arc-shaped cross section. Further, since the luminance improves due to the effect of the shape of the recessed portion, the panel display luminance is enhanced.

In this embodiment, the recessed portion structures are created over the entire sub-pixel region to provide an organic EL element 10, which enables an increase in the light-emitting efficiency of the display region E.

According to the configuration of this embodiment, the contact region, which has thus far been a portion serving as a non-emissive region, can be utilized as a light-emitting region 22. By forming a light-emitting region 22 including a contact region, the panel light-emitting efficiency improves, and a low power consumption display can be configured. In addition, the panel life can also be lengthened. Since an organic EL element 10 using the area near the focal point of the recessed portion shape of the reflective electrode 3 as a light-emitting area is formed, a low power consumption display with even higher efficiency can be configured.

In addition, an even more preferable structure of this embodiment is one in which the lowest part of the face on which the first electrode 4 is formed is lower than the uppermost face of the recessed portion 9. In a configuration in which the lowest portion of the face on which the first electrode 4 is formed is above the uppermost face of the recessed portion 9, the light-emitting components emitted to the side cannot be extracted to the upper face. However, by using a configuration in which the first electrode 4 is embedded inside the recessed portion 9, components emitted to at least part of the side of the light-emitting layer can be reflected onto the upper face and extracted.

Second Embodiment

Next, an organic EL device of a second embodiment of the disclosure will be described.

The basic structure of the organic EL device of this embodiment described below is substantially the same as that of the first embodiment described above, but differs in that the recessed portion is configured to include a portion of the drain electrode of the thin film transistor. Therefore, in the following description, the points of difference relative to the previous embodiment will be described in detail, and the description of parts in common will be omitted. In addition, in each of the drawings used in the description, components that are common to FIGS. 1 to 12D are labeled with the same symbols.

Figure 14:
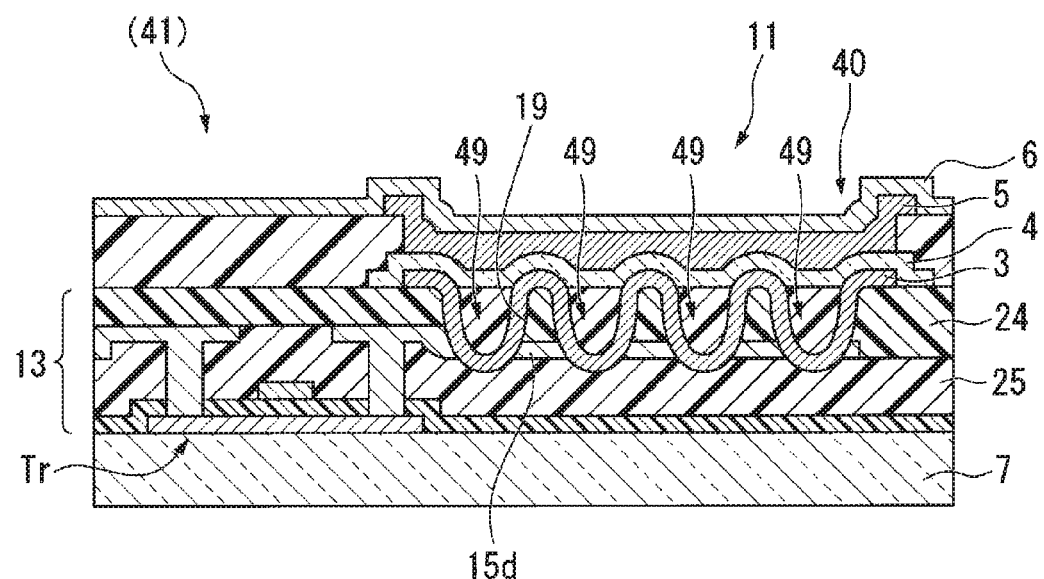
FIG. 14 is a cross-sectional view illustrating the structure of the organic EL device of a second embodiment.

FIG. 14 is a cross-sectional view illustrating the structure of an organic EL device of the second embodiment. Note that in FIG. 14, attention is focused on a single sub-pixel.

In the organic EL device 41 of this embodiment, as illustrated in FIG. 14, recessed portion structures are formed by carving into to the interlayer insulating film 25 of the TFT layer 13. Specifically, a plurality of recessed portions 49 formed to pass through the protection film 24 and the drain electrode 15d and to include a portion of the interlayer insulating film 25 are provided for each sub-pixel 11. Since the drain 15d is reliably exposed to the inner peripheral surface 19 of each recessed portion 49, the reflective electrode 3 and the drain electrode 15d are connected more reliably.

FIGS. 15A to 15E and FIGS. 16A and 16B illustrate a production process for the organic EL device of the second embodiment. FIG. 17 is a plan view of FIG. 15A from above.

As in the previous embodiment, after a thin film transistor Tr and a protection film are formed on a base material 7, a plurality of recessed portions 49 are formed for each sub-pixel 11.

Figure 15A:
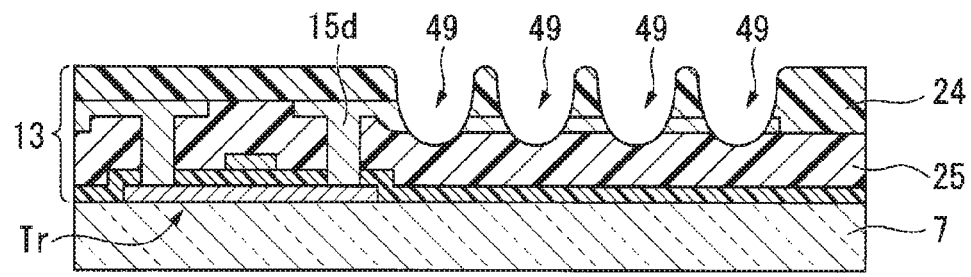
FIG. 15A is a first drawing illustrating the production process of the organic EL device of the second embodiment.

In this embodiment, as illustrated in FIG. 15A, each recessed portion 49 is formed to pass through the protection film 24 and the drain electrode 15d of the thin film transistor Tr and to indent a portion of the interlayer insulating film 25. Here, etching is performed with 1:10 buffered hydrofluoric acid for 450 to 600 seconds by a shower method. After the photoresist is then removed with a resist stripper, the substrate is washed and dried. This allows a recessed portion such as those illustrated in FIG. 15A to be formed.

In this embodiment, the etching time is longer than in the previous embodiment, and etching is performed to the interlayer insulating film 25 (SiNx) on the lower layer side of the drain electrode 15d made of titanium (Ti).

Since wet etching is performed isotropically, the recessed portion shape is substantially arc-shaped.

Here, as illustrated in FIG. 17, when the state illustrated in FIG. 15A is viewed from the upper face side, the drain electrode 15d is exposed to form a ring shape inside the recessed portion 49, and the drain electrode 15d forms a portion of the inner peripheral surface 19 of the recessed portion 49. The interlayer insulating film 25 is visible in the central portion of the recessed portion 49 and forms the base of the recessed portion 49.

In addition, in this embodiment, as illustrated in FIG. 17, a plurality of recessed portions 49 are arranged in two rows within the sub-pixel 11. Here, a total of 8 recessed portions 49 are provided in 2 rows×4 columns, but the number is not limited to this example.

As in the first embodiment, a pattern is formed sequentially from FIGS. 15B to 15E and FIGS. 16A and 16B.

Figure 15B:
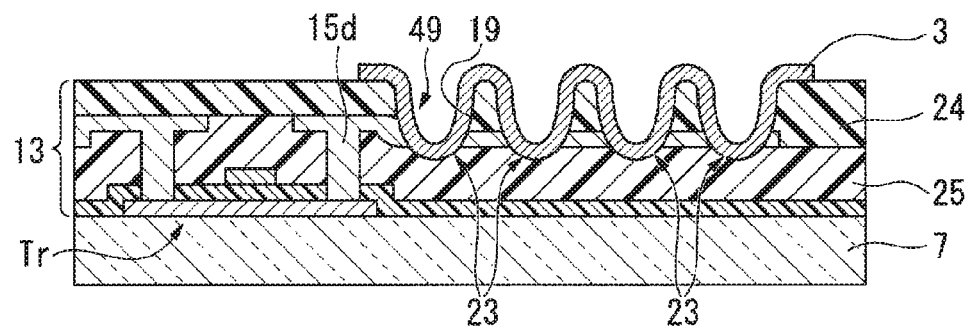
FIG. 15B is a second drawing illustrating the production process of the organic EL device of the second embodiment.

In FIG. 15B, when forming the reflective electrode 3 in each recessed portion 49, an Al film is formed by sputtering. This allows a film to be formed uniformly along the concave and convex shape. Therefore, the drain electrode 15d and the reflective electrode 3 can be connected reliably, and a plurality of contact portions 23 can be formed.

Figure 15C:
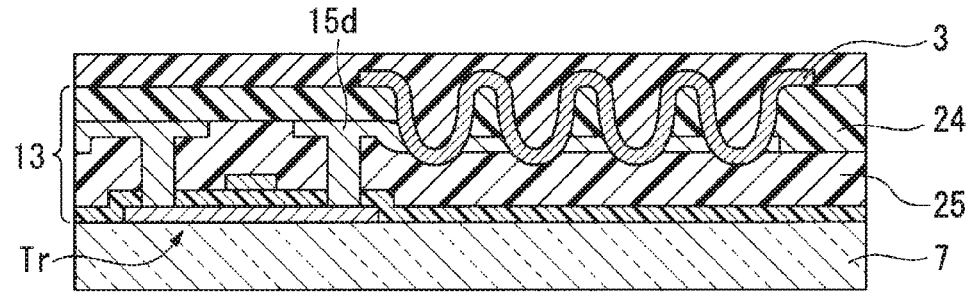
FIG. 15C is a third drawing illustrating the production process of the organic EL device of the second embodiment.

Next, as illustrated in FIG. 15C, an acrylic resin layer 35 is formed on the protection film 24 including the reflective electrode 3.

Figure 15D:
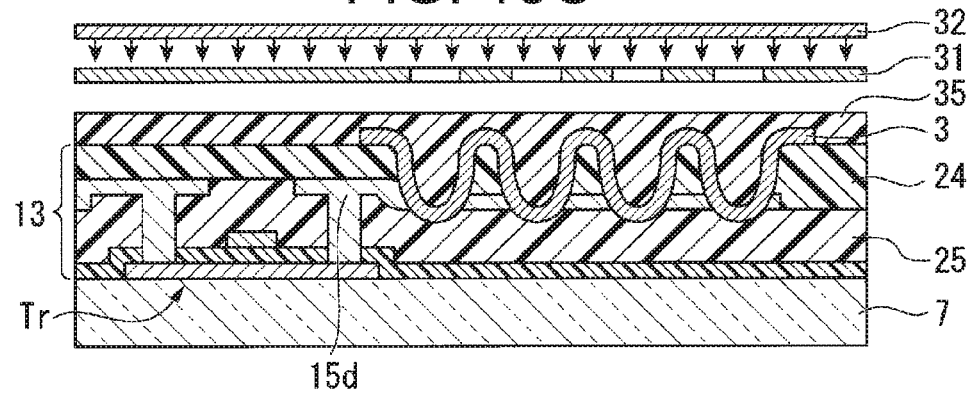
FIG. 15D is a fourth drawing illustrating the production process of the organic EL device of the second embodiment.

Next, as illustrated in FIG. 15D, the acrylic resin layer 35 is subjected to pattern exposure with an UV exposure device 32 using a photomask 31. After the acrylic resin layer 35 is exposed, the acrylic resin layer 35 is developed for 2 minutes with an alkaline developing solution having a concentration of a few %, washed with water, and dried, and the entire base material 7 is then baked in an oven at 200° C.

Figure 15E:
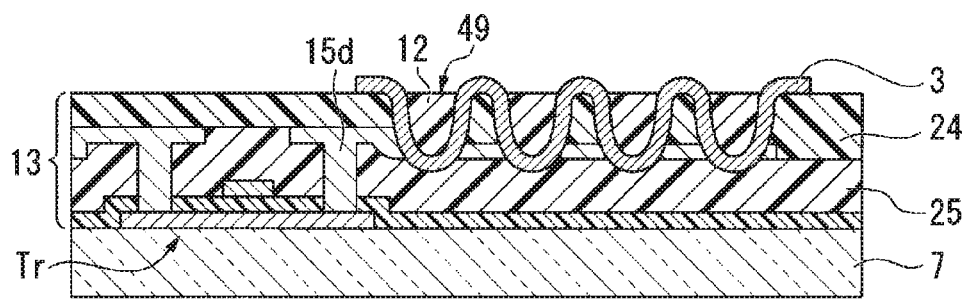
FIG. 15E is a fifth drawing illustrating the production process of the organic EL device of the second embodiment.

Thus, as illustrated in FIG. 15E, a filling layer 12 is formed in each of the plurality of recessed portions 49 provided for each sub-pixel 11.

Figure 16A:
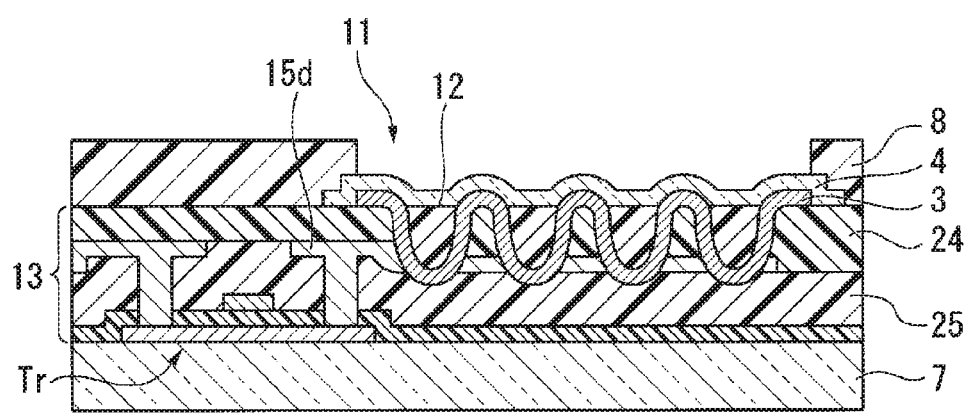
FIG. 16A is a sixth drawing illustrating the production process of the organic EL device of the second embodiment.
Figure 17:
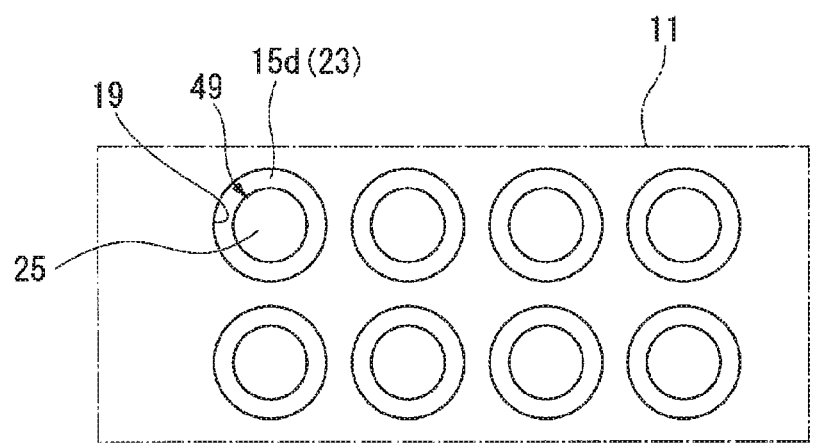
FIG. 17 is a plan view of FIG. 15A from above.

Next, as illustrated in FIG. 16A, an indium zinc oxide (IZO) film is formed as a first electrode 4 made of a transparent electrode to cover the reflective electrode 3 and the filling layer 12 with a thickness of 100 nm. A flattening film 8 is then formed as an edge cover material for covering the edges of the first electrode 4.

Figure 16B:
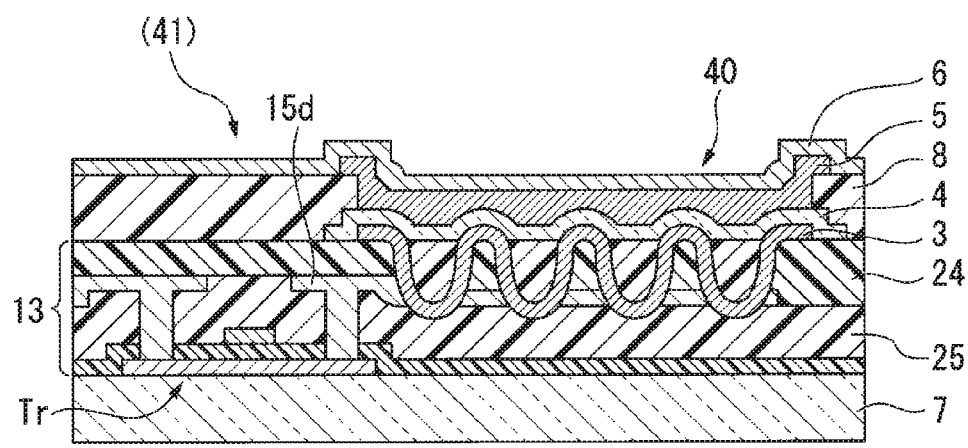
FIG. 16B is a seventh drawing illustrating the production process of the organic EL device of the second embodiment.

Then, as illustrated in FIG. 16B, an organic layer 5 is formed with a configuration such as that illustrated in Table 1 above, and a second electrode 6 is finally formed to cover the organic layer 5 formed for each sub-pixel 11. In this way, an organic EL element 40 is formed for each sub-pixel 11.

The organic EL device 41 of the present embodiment is completed by the process above.

Figure 18A:
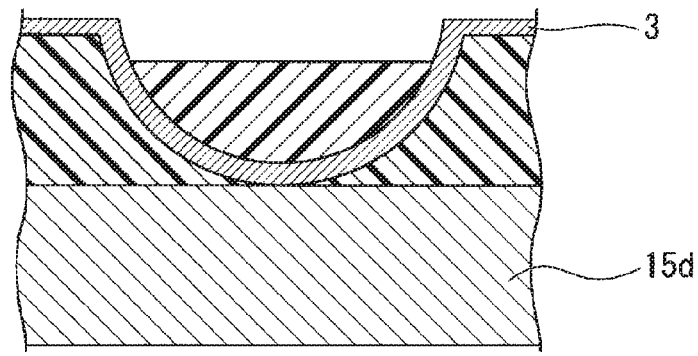
FIG. 18A is a first drawing illustrating differences in the structure of the contact portion.
Figure 18B:
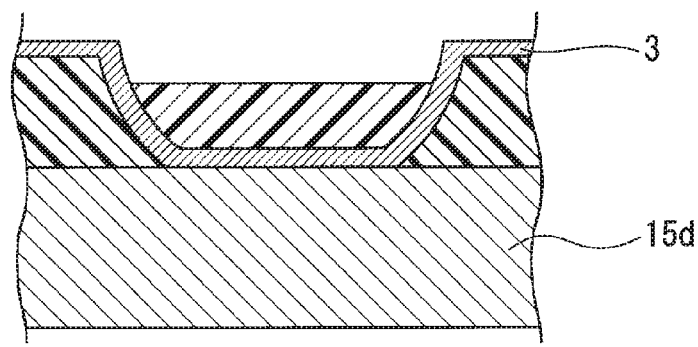
FIG. 18B is a second drawing illustrating differences in the structure of the contact portion.
Figure 18C:
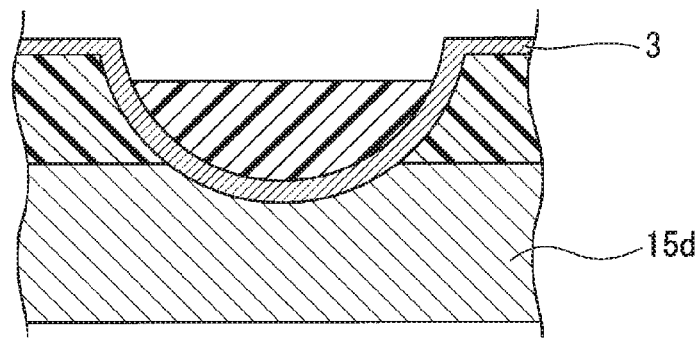
FIG. 18C is a third drawing illustrating differences in the structure of the contact portion.

FIGS. 18A to 18C illustrate differences in the structure of the contact portion.

As illustrated in FIG. 18A, when the light extraction efficiency is prioritized and forming the recessed portion with a substantially smooth arc shape is prioritized, the contact portion 23 becomes smaller.

As illustrated in FIG. 18B, although there are techniques for forming a portion of the reflective electrode 3 as a planar shape such that the contact can be more easily achieved on the base side of the recessed portion shape, the recessed portion shape becomes poor in this case, and the light extraction efficiency is diminished.

As in the case of the configuration of this embodiment illustrated in FIG. 18C, when the reflective electrode 3 and the drain electrode 15d are in contact each other at an intermediate point of the inclined face of the recessed portion shape, mutual contact is achieved reliably, and the recessed portion shape never becomes deformed, and therefore the light extraction efficiency never decreases.

To verify the effect of this embodiment, the present inventors created large panels using the organic EL device of the first embodiment and the organic EL device of the second embodiment described above and investigated the contact resistance with a TEG pattern.

As a result, the contact resistance in the configuration of this embodiment was a value approximately 1.5 times lower than that in the configuration of the first embodiment. Although neither is a problematic level in practice, the configuration of this embodiment enables a low contact resistance.

Third Embodiment

Next, an organic EL device of a third embodiment of the disclosure will be described.

The basic structure of the organic EL device of this embodiment described below is substantially the same as that of the first embodiment described above, but differs in that the recessed portion structures are formed on the interlayer insulating film 25 of the TFT layer 13. Therefore, in the following description, the points of difference relative to the previous embodiment will be described in detail, and the description of parts in common will be omitted. In addition, in each of the drawings used in the description, components that are common to FIGS. 1 to 12D are labeled with the same symbols.

Figure 19:
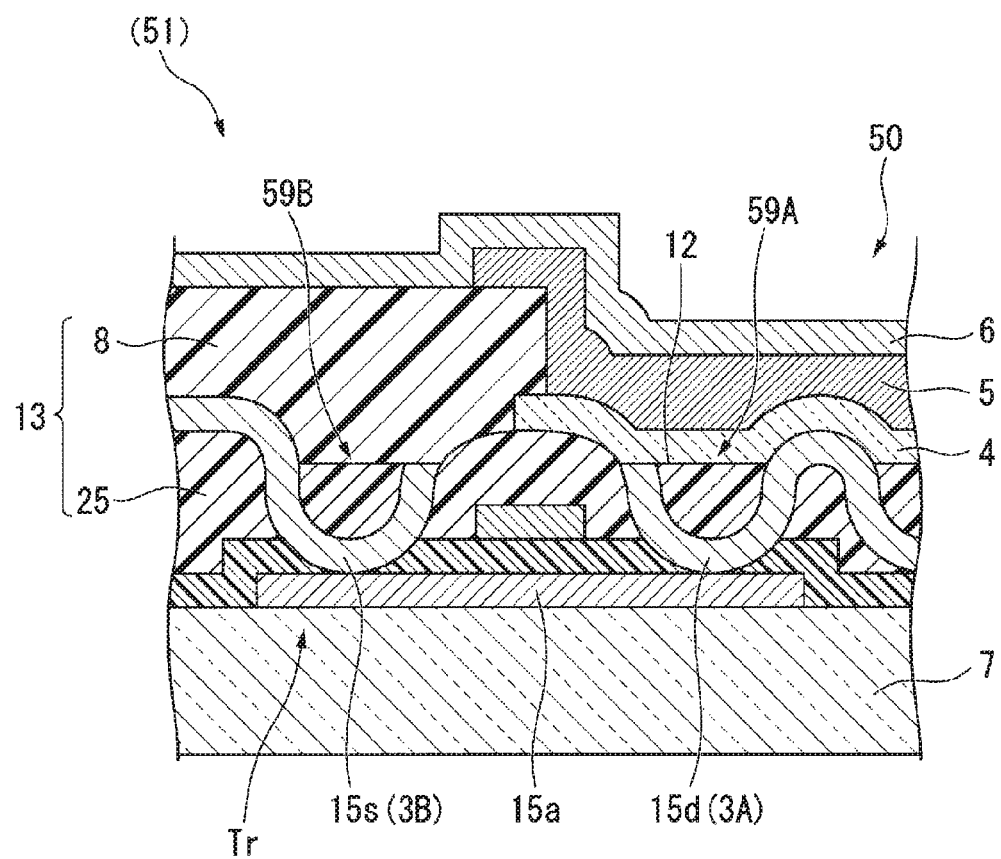
FIG. 19 is a cross-sectional view illustrating the structure of the organic EL device of a third embodiment.

FIG. 19 is a cross-sectional view illustrating the structure of the organic EL device of the third embodiment. Note that in FIG. 19, attention is focused on a single sub-pixel.

As illustrated in FIG. 19, in the organic EL device 51 of this embodiment, a plurality of recessed portion structures are formed in the interlayer insulating film 25 of the TFT layer 13. In addition, a recessed portion structure is provided at the contact portion between the drain electrode 15d of the thin film transistor Tr and the low-temperature polysilicon layer 15a, resulting in a configuration in which the thin film transistor Tr is also included in the light emission area. Further, by also forming the contact portion between the source electrode 15s and the low-temperature polysilicon layer 15a as a recessed portion structure, it is unnecessary to form a contact hole. This enables the simplification of the process.

In addition, although the low-temperature polysilicon layer 15a was used in this embodiment, an amorphous silicon (a-Si) semiconductor or an oxide semiconductor may also be used. Although a top-gate format was employed as the structure of the thin film transistor Tr in this embodiment, a bottom-gate format may also be used.

A reflective electrode (first reflective layer) 3A is formed over a plurality of recessed portions 59A formed in the interlayer insulating film 25. One first recessed portion 59A of the plurality of first recessed portions 59A is positioned above the low-temperature polysilicon layer 15a of the thin film transistor Tr. A portion of the reflective electrode 3A in the first recessed portion 59A at this position is connected to the low-temperature polysilicon layer 15a. As a result, the entire reflective electrode 3A functions as a drain electrode 15d.

A second recessed portion 59B is further formed in the interlayer insulating film 25 of this embodiment. The second recessed portion 59B is formed above the low-temperature polysilicon layer 15a on a different side than the drain electrode 15d side. A portion of a reflective electrode (second reflective layer) 3B formed in this second recessed portion 59B is connected to the low-temperature polysilicon layer 15a. As a result, the entire reflective electrode 3B functions as a source electrode 15s.

Such a configuration enables production of a recessed portion structure on the substrate with fewer steps, and enables an improvement in yield and a reduction in cost due to the enhancement of throughput and a reduction in the number of steps.

Figure 20A:
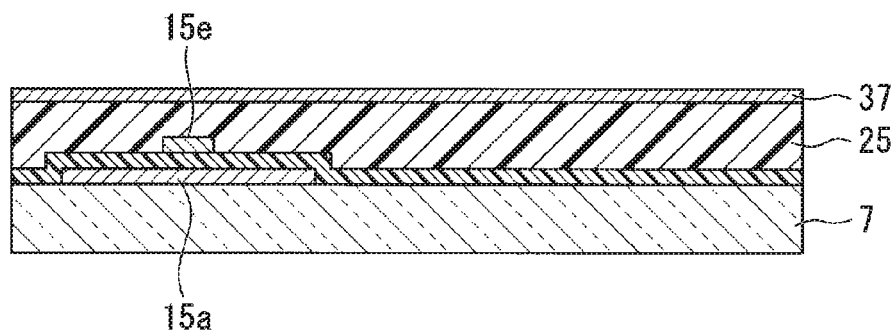
FIG. 20A is a first drawing illustrating the production process of the organic EL device of the third embodiment.
Figure 20B:
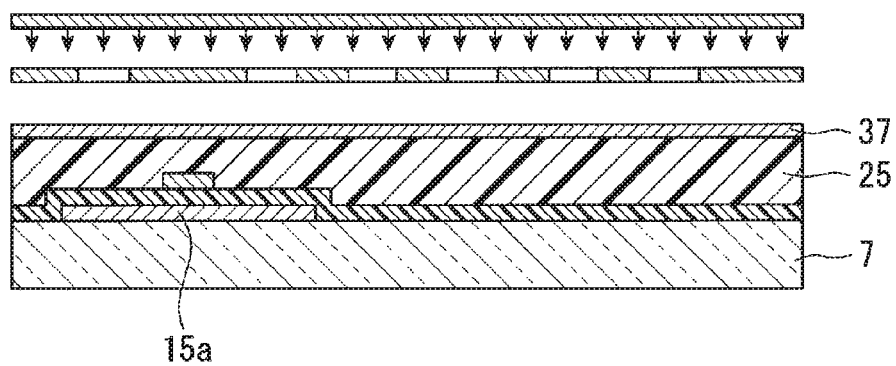
FIG. 20B is a second drawing illustrating the production process of the organic EL device of the third embodiment.
Figure 20C:
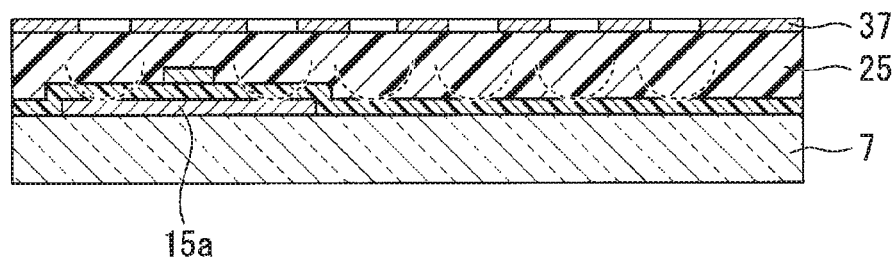
FIG. 20C is a third drawing illustrating the production process of the organic EL device of the third embodiment.
Figure 20D:
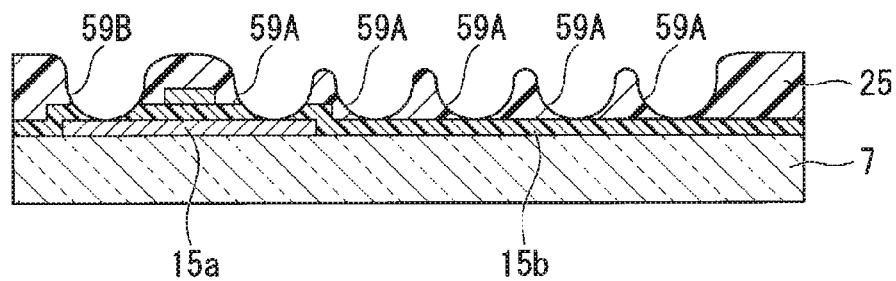
FIG. 20D is a fourth drawing illustrating the production process of the organic EL device of the third embodiment.
Figure 21A:
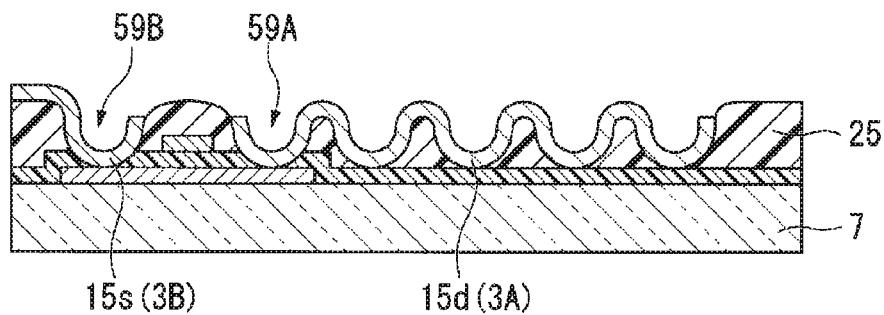
FIG. 21A is a fifth drawing illustrating the production process of the organic EL device of the third embodiment.

FIGS. 20A to 20D and FIGS. 21A to 21D illustrate a production process for the organic EL device of the third embodiment. FIG. 22 is a flowchart illustrating the production process of this embodiment. FIG. 23 is a flowchart illustrating the production process of the third embodiment.

As in the first embodiment, after components are formed up to the interlayer insulating film 25 on the base material 7 (FIG. 22: step S1), as illustrated in FIG. 20A, a photoresist 37 is applied to the interlayer insulating film 25 by spin coating, and the product is then pre-baked.

Then, as illustrated in FIG. 20B, the interlayer insulating film 25 is subjected to pattern exposure through the photoresist 37 with a prescribed photomask 31 and an UV exposure device 32. The product is then developed for 2 minutes with an alkaline developing solution with a concentration of a few %, as illustrated in FIG. 20C.

Then, shower etching is performed with 1:10 buffered hydrofluoric acid for 250 to 350 seconds. After the photoresist 37 is then removed with a resist stripper, the substrate is washed and dried with nitrogen ($N_2$). This allows a recessed portion such as those illustrated in FIG. 20D to be formed. Thus, a plurality of first recessed portions 59A and a second recessed portion 59B are formed in the interlayer insulating film 25 (FIG. 22: step S2). At this time, the gate insulating film 15b is etched until the low-temperature polysilicon layer 15a is exposed.

Then, a Ti film is formed with a thickness of 200 nm by a known sputtering method on the inside of the plurality of first recessed portions 59A and the second recessed portion 59B. A prescribed pattern is then formed by means of known photoetching and peeling processes. That is, a photoresist is applied by a spin coating method, and the photoresist is formed in a prescribed pattern using a photomask with a prescribed pattern and an UV exposure device. The Ti film is then etched with a known dry etching method. The photoresist is then removed with a stripper. In this way, as illustrated in FIG. 21A, reflective electrodes 3A are formed in the plurality of first recessed portions 59A, and a reflective electrode 3B is formed in the second recessed portion 59B (FIG. 22: step S3).

Figure 21B:
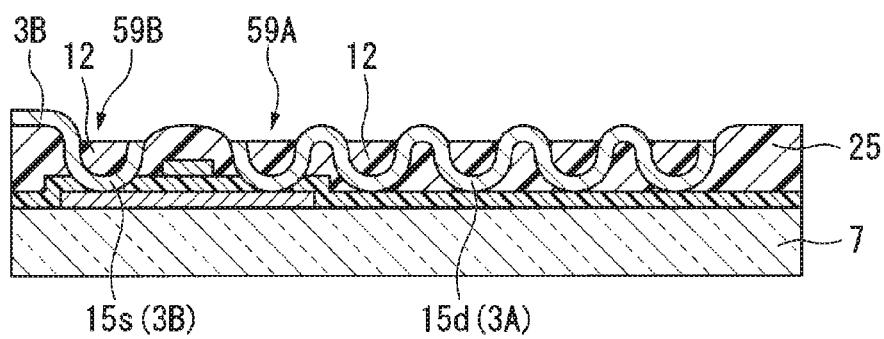
FIG. 21B is a sixth drawing illustrating the production process of the organic EL device of the third embodiment.
Figure 21C:
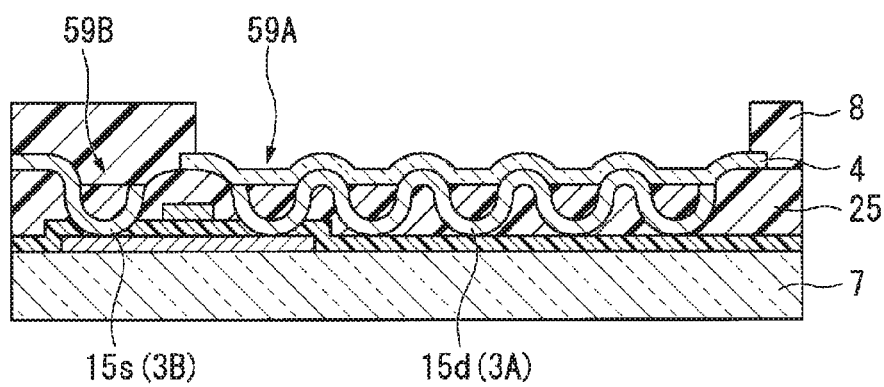
FIG. 21C is a seventh drawing illustrating the production process of the organic EL device of the third embodiment.
Figure 21D:
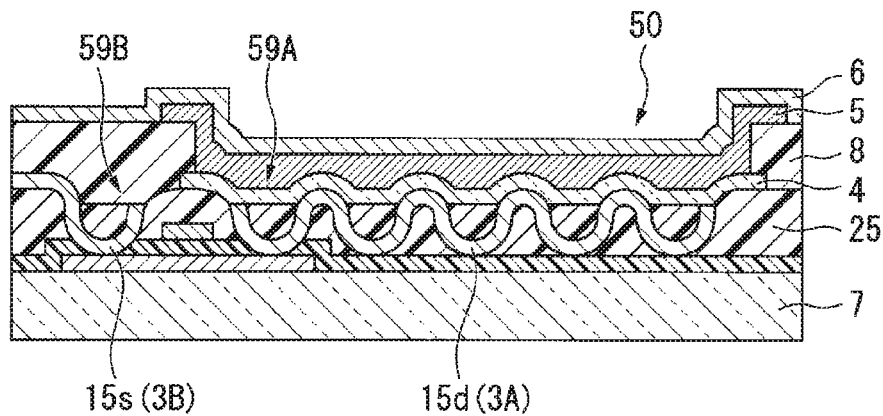
FIG. 21D is an eighth drawing illustrating the production process of the organic EL device of the third embodiment.
Figure 22:
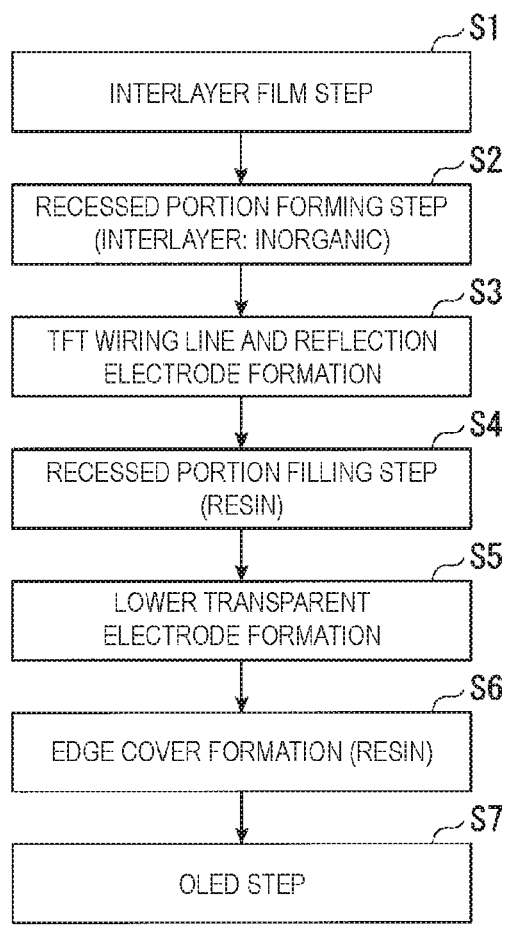
FIG. 22 is a flowchart illustrating the production process of the embodiment.
Figure 23:
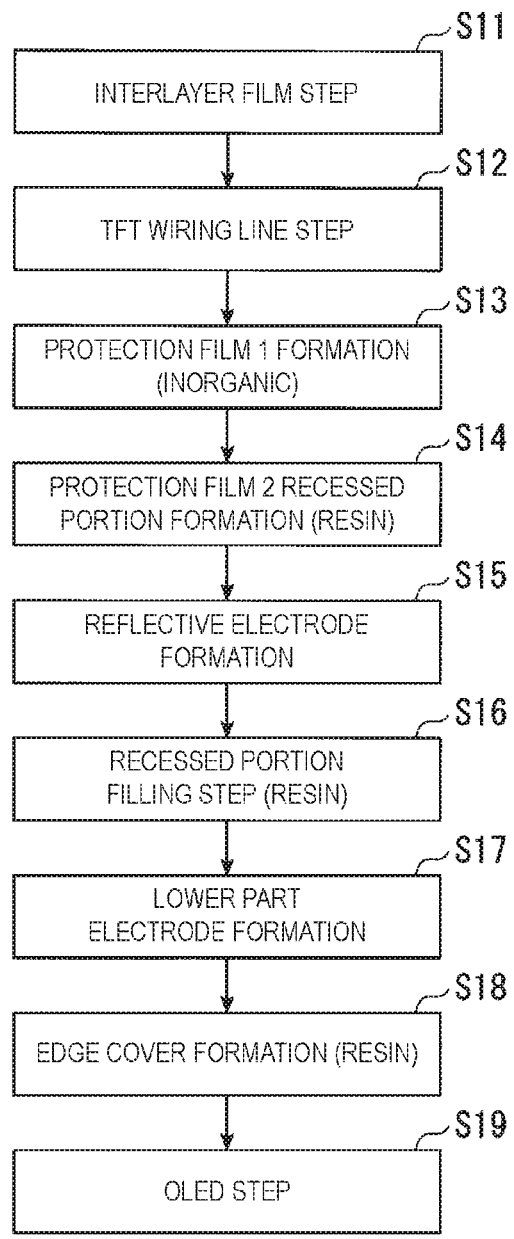
FIG. 23 is a flowchart illustrating the production process of the third embodiment.

Then, as illustrated in FIG. 21B, as in the first embodiment, a filling layer 12 is formed in each of the first recessed portions 59A and the second recessed portion 59B (FIG. 22: step S4).

After a first electrode 4 is formed on the plurality of first recessed portions 59A (FIG. 22: step S5), a flattening film 8 is formed as an edge cover of the first electrode 4 (FIG. 22: step S6). At this time, the flattening film 8 is formed on the interlayer insulating film 25 to cover the reflective electrode 3B and the filling layer 12 in each recessed portion 59A.

Then, as in the first embodiment, an organic layer 5 and a second electrode 6 are formed to form an organic EL element 50 on each of the first recessed portions 59A (FIG. 22: step S7).

Thus, the organic EL device 51 of the present embodiment is completed.

With the configuration of this embodiment, a recessed portion structure can be formed with fewer processes by using a recessed portion structure in the configuration of the contact portions between the drain electrode 15d and the source electrode 15s of the thin film transistor Tr and the low-temperature polysilicon layer 15a.

As illustrated in FIG. 23, in the configuration of the first embodiment, it was necessary to separately perform a step for forming the wiring line of the thin film transistor Tr (step S12) and a step for forming the reflective electrode 3 (step S15). In the configuration of this embodiment, since the reflective electrodes 3A and 3B are allowed to function as a drain electrode 15d and a source electrode 15s, respectively, a single step such as step S3 illustrated in FIG. 22 is sufficient.

In addition, in this embodiment, since the protection film 24 on the thin film transistor Tr becomes unnecessary, the steps for forming these parts can be omitted, and the number of processes can be further reduced.

Fourth Embodiment

Next, an organic EL device of a fourth embodiment of the disclosure will be described.

The basic structure of the organic EL device of this embodiment described below is substantially the same as that of the first embodiment described above, but differs in that the sizes of the plurality of organic EL elements provided in a sub-pixel differ from one another in a plan view. Therefore, in the following description, the points of difference relative to the previous embodiment will be described in detail, and the description of parts in common will be omitted. In addition, in each of the drawings used in the description, components that are common to FIGS. 1 to 12D are labeled with the same symbols.

Figure 24A:
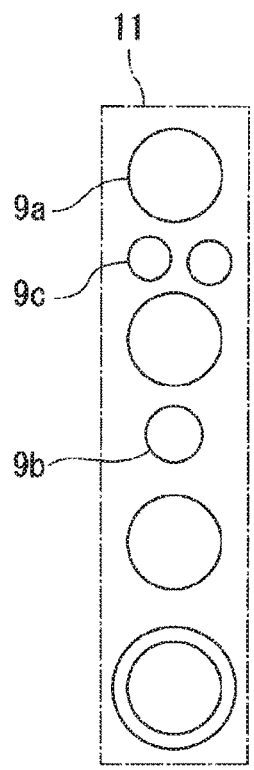
FIG. 24A is a plan view illustrating the structure of one sub-pixel in the organic EL device of a fourth embodiment.

FIG. 24A is a plan view illustrating the configuration of one sub-pixel in an organic EL device of a fourth embodiment.

In the organic EL device of this embodiment, as illustrated in FIG. 24A, the size of each recessed portion structure provided in the sub-pixel 11 differs in a plan view.

A plurality of recessed portion structures are formed in the sub-pixel 11 with the following size relationship in a plan view: first recessed portion 9a>second recessed portion 9b>third recessed portion 9c. Although all of the sizes differ in a plan view, the depths are the same as one another.

Here, at least one of the plurality of first recessed portions 9a may be electrically connected to the drain electrode of the thin film transistor. To reliably avoid connection failure, each reflective electrode 3 and the drain electrode of the thin film transistor may be electrically connected through each opening provided on the base side of each of the recessed portions 9a, 9b, and 9c.

Figure 25A:
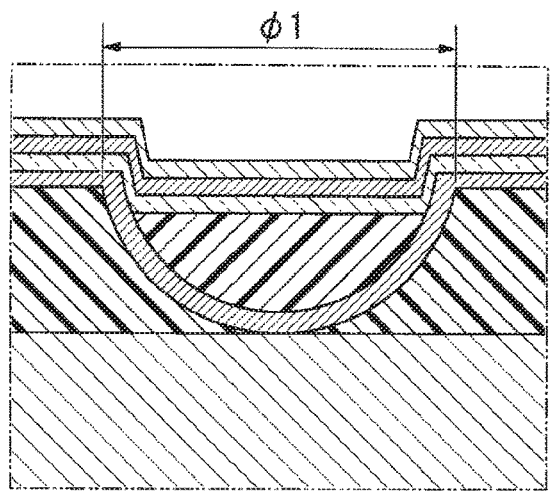
FIG. 25A is a first cross-sectional view illustrating each pattern shape of the recessed portion structures having different sizes in a plan view.
Figure 25B:
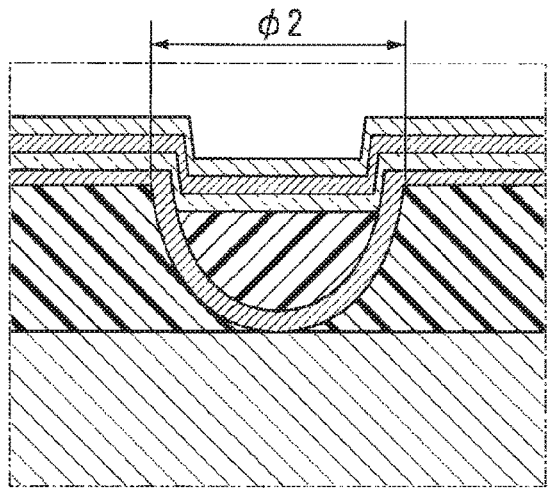
FIG. 25B is a second cross-sectional view illustrating each pattern shape of the recessed portion structures having different sizes in a plan view.
Figure 25C:
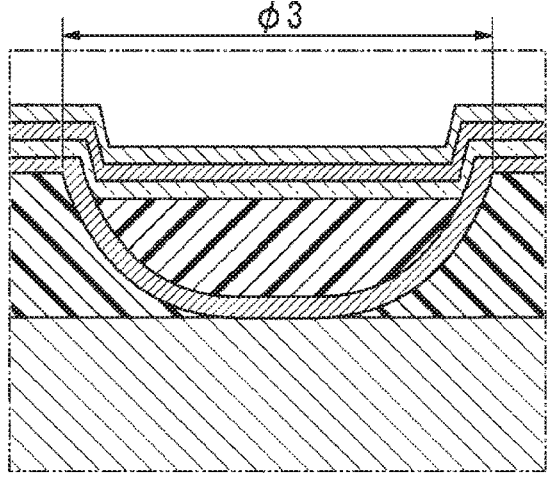
FIG. 25C is a third cross-sectional view illustrating each pattern shape of the recessed portion structures having different sizes in a plan view.

FIGS. 25A to 25C are cross-sectional views illustrating each pattern shape of the recessed portion structures having different sizes in a plan view.

FIG. 25A illustrates a recessed portion structure with a diameter φ1 of from 5 to 7 μm. Using this recessed portion structure as a basic structure, the recessed portion structure illustrated in FIG. 25B has a smaller diameter than the basic structure, and the diameter is less than 5 μm. In addition, the recessed portion structure illustrated in FIG. 25C has a greater diameter than the basic structure, and the diameter φ3 is 8 μm or greater.

By providing recessed portion structures with different sizes in the sub-pixel, the arrangement density of elements can be increased. This increases the luminance-enhancing effect. Further, by disposing organic EL elements that are larger than the basic structure, the amount of light extracted to the upper side can be increased.

As a result, the luminance of the sub-pixel 11 can be increased, and a display device with a wide viewing angle can be formed.

To verify the effect of this embodiment, the present inventors created large panels using the organic EL device of the first embodiment described above and the organic EL device of this embodiment. Here, using a configuration not including the contact portions illustrated in the drawings as a reference, the luminance enhancement rate at a constant current was investigated in each embodiment. In each embodiment, color-coded type organic EL elements and color filter type organic EL elements were compared.

The results are listed in Table 2.

TABLE 2

|  | First Embodiment | Fourth Embodiment |
| --- | --- | --- |
| FIGS. A and B | 2.1 | 2.5 |
| FIGS. C and D | 2 | 2.4 |

As illustrated in Table 2, since both the first embodiment and the fourth embodiment are configured to include normal contact portions, the luminance improved dramatically over the reference configuration not including a contact portion. In addition, the configuration of the fourth embodiment yielded a higher light extraction efficiency and greater enhancement of luminance than the configuration of the first embodiment.

Figure 24B:
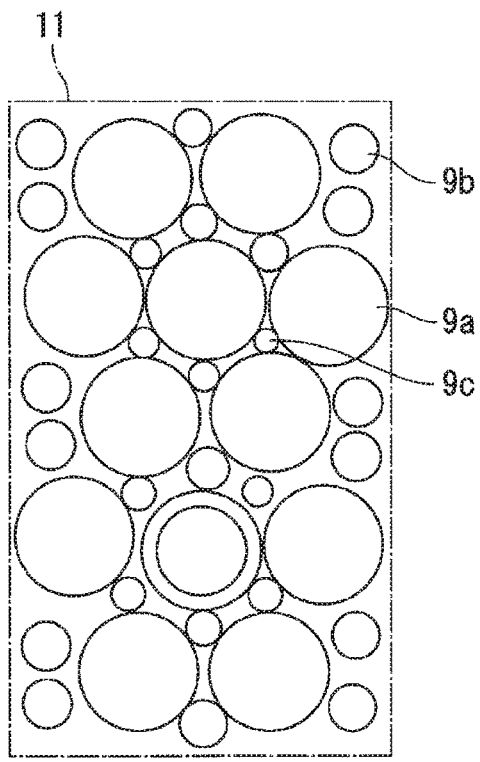
FIG. 24B is a plan view illustrating an example of the arrangement pattern of the recessed portion structures inside one sub-pixel of the organic EL device of the fourth embodiment.

FIG. 24B is a plan view illustrating an example of the arrangement pattern of the recessed portion structures in one sub-pixel.

As illustrated in FIG. 24B, six third recessed portions 9c are disposed around one first recessed portion 9a, and six first recessed portions 9a are further disposed on the outside of the third recessed portions 9c. In addition, a plurality of second recessed portions 9b are arranged to fill the gaps in the sub-pixel 11.

When a plurality of recessed portions 9a to 9c of different sizes are provided in this way, the arrangement density of elements in a single sub-pixel 11 increases, further enhancing the luminance.

Note that the arrangement pattern of each of the recessed portions 9a to 9c illustrated in FIGS. 24A and 24B are simply examples, and the recessed portions may also be arranged in other patterns. In addition, the sizes of the recessed portions are not limited to only three patterns.

Preferred embodiments of the disclosure were described above with reference to the attached drawings, but it goes without saying that the disclosure is not limited to these examples. It will be clear to a person skilled in the art that various modifications and amendments can be imagined within the scope of the technical ideas described in the Scope of the Patent Claims, and it is understood that these modifications and amendments also obviously fall under the technical scope of the disclosure.

In each of the embodiments above, a plurality of organic EL elements 10 were arranged over substantially the entire region within the sub-pixel 11 including a contact region, but the disclosure is not limited to this configuration. As long as at least one of the plurality of organic EL elements 10 provided in the sub-pixel 11 is provided in the contact region, the other organic EL elements 10 may be arrange in any manner.

Although a description has been given in the embodiments above regarding examples of cases in which the cross-sectional shape of the recessed portion is an arc shape, the cross-sectional shape of the recessed portion is not necessarily be an arc shape. The cross-sectional shape of the recessed portion may include an ellipse or any curve, for example, and may also include a portion of a straight line.

In addition, specific configuration such as the shape, dimensions, number, disposition, constituent materials, and forming processes of each portion of the organic EL device are not limited to the embodiments above, and may be appropriately modified.

Moreover, the organic EL device of the disclosure may be applied to an illumination device or the like in addition to a display device. For example, when an aspect of the disclosure is applied to an illumination device configured to generate white light, it is not necessary to include a plurality of mutually divided unit regions of different light-emitting colors as illustrated in the embodiments above.

Specifically, a single light-emitting layer may be doped with three types of dopant colorants (red, green, and blue), for example. Alternatively, a layered structure including a blue hole transporting light-emitting layer, a green electron transporting light-emitting layer, and a red electron transporting light-emitting layer may be used. A layered structure including a blue electron light-emitting layer, a green electron transporting light-emitting layer, and a red electron transporting light-emitting layer may also be used.

INDUSTRIAL APPLICABILITY

Several aspects of the disclosure may be utilized in a freely-selected electrical device provided with a light-emitting part such as a display device or an illumination device.

REFERENCE SIGNS LIST

1 Organic EL device (organic electroluminescence device, illumination device, and display device)
3 Reflective electrode (reflective layer)
3A Reflective electrode (first reflective layer)
3B Reflective electrode (second reflective layer)
4 First electrode
5 Organic layer
6 Second electrode 7 Base material
8, 27 Flattening film
9, 9a, 49, 59A Recessed portion
9A Opening
9a, 59A First recessed portion
9b, 59B Second recessed portion
E Display region
Q Plane
10 Organic EL element (light-emitting element)
11 Sub-pixel (unit region)
12 Filling layer
15d Drain electrode
15s Source electrode
16 Light-emitting layer
19 Inner peripheral surface (front surface)
24 Protection film
25 Interlayer insulating film
L1 Light
S1, S2, S3, S4, S5, S6, S7 Step
Tr Thin film transistor (active element)

The invention claimed is:

1. An electroluminescence device comprising:
   a base material provided with a plurality of recessed portions on one side;
   a light-emitting element including a reflective layer provided on at least a surface of the recessed portions, a filling layer having optical transparency and filling an inside of each of the recessed portions with the reflective layer interposed therebetween, a first electrode having optical transparency provided on at least an upper layer side of the filling layer, an organic layer including at least a light-emitting layer provided on an upper layer of the first electrode, and a second electrode having optical transparency provided on an upper layer side of the organic layer; and
   an active element connected to the light-emitting element, wherein
   a display region includes a plurality of unit regions divided from one another,
   each of the unit regions includes the light-emitting element defined in the recessed portions and the active element to control light emission of the light-emitting element,
   the light-emitting element and the active element in each of the unit regions are electrically connected via at least one of the recessed portions,
   the first electrode includes a step that extends along an edge portion of each of the recessed portions, and
   the first electrode contacts the reflective layer at the edge portion.

2. The electroluminescence device according to claim 1, wherein the light-emitting element and the active element are electrically connected via the recessed portion present in each of the unit regions.

3. The electroluminescence device according to claim 1, further comprising:
   a protection film defined on an upper layer of the active element; and
   a flattening film defined on an upper layer of the protection film, wherein
   the recessed portions are defined on the protection film.

4. The electroluminescence device according to claim 1, wherein
   an opening exposing a wiring line of the active element is provided in the at least one of the recessed portions, and
   the wiring line and the reflective layer are connected via the opening.

5. The electroluminescence device according to claim 4, wherein each of the recessed portions is defined to pass through the wiring line of the active element.

6. The electroluminescence device according to claim 1, wherein the light-emitting element includes a plurality of light-emitting elements and sizes of the plurality of light-emitting elements in a plan view differ from one another.

7. The electroluminescence device according to claim 1, wherein a first upper surface of the filling layer in each of the recessed portions is below a plane that includes a second upper surface of the reflective layer.

8. An organic electroluminescence device comprising:
   a base material provided with a plurality of recessed portions on one side;
   a light-emitting element including a reflective layer provided on at least a surface of the recessed portions, a filling layer having optical transparency and filling the inside of each of the recessed portions with the reflective layer interposed therebetween, a first electrode having optical transparency provided on at least an upper layer side of the filling layer, an organic layer including at least a light-emitting layer provided on an upper layer of the first electrode, and a second electrode having optical transparency provided on an upper layer side of the organic layer; and
   an active element connected to the light-emitting element, wherein
   a display region includes a plurality of unit regions divided from one another,
   each of the unit regions includes the light-emitting element and the active element to control light emission of the light-emitting element,
   the recessed portions include a plurality of first recessed portions defined in an interlayer insulating film of the active element,
   the reflective layer defined in the first recessed portions functions as a drain electrode of the active element,
   the first electrode includes a step that extends along an edge portion of each of the recessed portions, and
   the first electrode contacts the reflective layer at the edge portion.

9. The electroluminescence device according to claim 8, wherein
   the recessed portions further include a second recessed portion in the interlayer insulating film, and
   a second reflective layer in the second recessed portion is a source electrode of the active element.

10. The electroluminescence device according to claim 8, wherein a first upper surface of the filling layer in each of the recessed portions is below a plane that includes a second upper surface of the reflective layer.

11. An illumination device comprising:
   a base material provided with a plurality of recessed portions on one side;
   a light-emitting element including a reflective layer provided on at least a surface of the recessed portions, a filling layer having optical transparency and filling an inside of each of the recessed portions with the reflective layer interposed therebetween, a first electrode having optical transparency provided on at least an upper layer side of the filling layer, an organic layer including at least a light-emitting layer provided on an upper layer of the first electrode, and a second electrode having optical transparency provided on an upper layer side of the organic layer; and
   an active element connected to the light-emitting element, wherein a display region includes a plurality of unit regions divided from one another, each of the unit regions include the light-emitting element defined in the recessed portions and the active element to control light emission of the light-emitting element, the light-emitting element and the active element in each of the unit regions are electrically connected via at least one of the recessed portions, the first electrode includes a step that extends along an edge portion of each of the recessed portions, and the first electrode contacts the reflective layer at the edge portion.

12. The electroluminescence device according to claim 11, wherein a first upper surface of the filling layer in each of the recessed portions is below a plane that includes a second upper surface of the reflective layer.

* * * * *